United States Patent
Hsiao et al.

(10) Patent No.: US 12,113,516 B2
(45) Date of Patent: Oct. 8, 2024

(54) ACOUSTIC-WAVE LADDER FILTER HAVING IMPEDANCE ELEMENT AND DIPLEXER BASED THEREON

(71) Applicant: TAI-SAW Technology Co., Ltd., Taoyuan (TW)

(72) Inventors: Chih-Chung Hsiao, Taoyuan (TW); Fu-Kuo Yu, Taoyuan (TW); Shih-Meng Lin, Taoyuan (TW)

(73) Assignee: TAI-SAW TECHNOLOGY CO., LTD., Taoyuan (TW)

( * ) Notice: Subject to any disclaimer, the term of this patent is extended or adjusted under 35 U.S.C. 154(b) by 441 days.

(21) Appl. No.: 17/524,939

(22) Filed: Nov. 12, 2021

(65) Prior Publication Data
US 2022/0158624 A1 May 19, 2022

(30) Foreign Application Priority Data
Nov. 13, 2020 (TW) ................... 109139800

(51) Int. Cl.
*H03H 9/64* (2006.01)
*H03H 9/02* (2006.01)

(52) U.S. Cl.
CPC ...... *H03H 9/6483* (2013.01); *H03H 9/02543* (2013.01); *H03H 9/02992* (2013.01)

(58) Field of Classification Search
CPC ............. H03H 9/6483; H03H 9/02543; H03H 9/02992; H03H 9/0542; H03H 9/542; H01F 17/0006
See application file for complete search history.

(56) References Cited

U.S. PATENT DOCUMENTS

| | | | |
|---|---|---|---|
| 2012/0025929 A1 | 2/2012 | Muterspaugh | |
| 2013/0039228 A1* | 2/2013 | Caron | H04B 1/52 370/278 |
| 2013/0109332 A1* | 5/2013 | Aigner | H03H 9/568 333/186 |
| 2014/0111287 A1 | 4/2014 | Hara | |
| 2014/0266511 A1* | 9/2014 | Turner | G06F 30/327 716/104 |
| 2020/0136592 A1* | 4/2020 | Nosaka | H03H 9/6403 |
| 2020/0220522 A1 | 7/2020 | Nosaka | |
| 2023/0353125 A1* | 11/2023 | Xu | H03H 9/605 |

FOREIGN PATENT DOCUMENTS

| | | | | |
|---|---|---|---|---|
| CN | 108352824 A | * | 7/2018 | ............... H03H 9/54 |
| WO | WO-2010004686 A1 | * | 1/2010 | ........... H03H 9/0085 |

* cited by examiner

*Primary Examiner* — Andrea Lindgren Baltzell
*Assistant Examiner* — Kimberly E Glenn
(74) *Attorney, Agent, or Firm* — Volpe Koenig

(57) ABSTRACT

An acoustic-wave ladder filter has a first port, a second port and a ground terminal, and includes a series resonator and a shunt circuit. The series resonator is coupled to and disposed between the first and the second ports in series. The shunt circuit is coupled to and disposed between the series resonator and the grounding terminal, and includes a shunt resonator and a functional circuit. The functional circuit is connected in series with the shunt resonator. The functional circuit includes a resistor having a resistance value. The resistance value is greater than 5 Ohms and is smaller than 50 ohms. The functional circuit may further have an inductance.

18 Claims, 31 Drawing Sheets

ACOUSTIC-WAVE LADDER FILTER HAVING IMPEDANCE ELEMENT AND DIPLEXER BASED THEREON

CROSS-REFERENCE TO RELATED APPLICATION AND CLAIM OF PRIORITY

The application claims the benefit of Taiwan Patent Application No. 109139800, filed on Nov. 13, 2020, at the Taiwan Intellectual Property Office, the disclosures of which are incorporated herein in their entirety by reference.

TECHNICAL FIELD

The present disclosure is related to a ladder filter and, more particularly, is related to a Surface-Acoustic-Wave (SAW) ladder filter used for a diplexer.

BACKGROUND

The SAW technology has many different applications in radio electronics and a Radio Frequency (RF) field. Due to the fact that the SAW velocity is about 100,000 times smaller than that of electromagnetic waves, the SAW technology can be applied to special applications where miniaturization is important or desirable.

For example, a SAW impedance element is used to form a ladder-type impedance element, and includes an InterDigital Transducer (IDT) and two reflecting gratings deposited on a surface of a piezoelectric substrate. The IDT includes two sets of metal strips (electrode fingers), which are formed on the surface of the piezoelectric substrate. The electrode fingers in each set are connected by a bus bar. The SAW impedance element can generate surface acoustic waves in both directions under a condition that a voltage is applied to the two bus bars due to the piezo-effect. Each of the two reflecting gratings is used to a surface acoustic wave, and includes a periodic system of planar electrodes disposed on an acoustic channel of the IDT. System electrodes included in the IDT and the two reflecting gratings are parallel.

Please refer to FIG. 1, which is a schematic diagram showing a structure of an impedance element 100 in the prior art. The impedance element 100 is a Surface-Acoustic-Wave (SAW) impedance element, and has a structure of a SAW resonator. Since 1993, a resonator included in a SAW ladder filter is referred to as an impedance element; and a SAW ladder filter is referred to as an impedance element filter. As shown in FIG. 1, the impedance element 100 serving as a resonator is disposed on a piezoelectric substrate 110, and includes an interdigital transducer 101, a reflector 105 and a reflector 106. The reflectors 105 and 106 are two reflecting gratings, respectively. The piezoelectric substrate 110 has a surface 111.

The interdigital transducer 101 includes a conductive bus bar 103, a conductive bus bar 104, a plurality of finger electrodes 108 extending from the conductive bus bar 103, and a plurality of finger electrodes 109 extending from the conductive bus bar 104. The surface 111 has an acoustic channel 107 used for the impedance element 100. Each of the interdigital transducer 101 and the reflectors 105 and 106 is disposed on the acoustic channel 107. The electrodes of the reflectors 105 and 106 are usually short-circuited.

Sometimes, the reflector 105 is electrically connected to one of the conductive bus bars 103 and 104. The reflector 105 is electrically connected to one of the conductive bus bars 103 and 104. The impedance element 100 can further include two electrical terminals (not shown). The conductive bus bars 103 and 104 are respectively connected to the two electrical terminals. The interdigital transducer 101 has an aperture W1. Each of the plurality of finger electrodes 108 and the plurality of finger electrodes 109 has an electrode period P1.

Please refer to FIG. 2, which is a schematic diagram showing a structure of an impedance element filter 120 in the prior art. As shown in FIG. 2, the impedance element filter 120 is a SAW ladder filter, and includes a series resonator 150 and a shunt resonator 130 (or a parallel resonator) electrically connected to the series resonator 150. The impedance element filter 120 can be used for a diplexer. In order to cause the diplexer to meet a specific frequency response specification, there is a demand to improve the impedance element filter 120.

SUMMARY OF EXEMPLARY EMBODIMENTS

It is one aspect of the present disclosure to provide an acoustic-wave ladder filter used for a diplexer, wherein the acoustic-wave ladder filter has a specific circuit structure to cause the diplexer to easily meet a specific diplexer specification.

It is therefore one embodiment of the present disclosure to provide an acoustic-wave ladder filter. The acoustic-wave ladder filter has a first port, a second port and a grounding terminal, and includes a first series resonator and a shunt circuit. The first series resonator is coupled to and disposed between the first and the second ports in series. The shunt circuit is coupled to and disposed between the first series resonator and the grounding terminal, and includes a first shunt resonator and a functional circuit. The functional circuit is connected in series with the first shunt resonator, wherein the functional circuit includes a resistor having a resistance value being greater than 5 Ohms.

It is therefore another embodiment of the present disclosure to provide an acoustic-wave ladder filter. The acoustic-wave ladder filter has a first port, a second port and a grounding terminal, and includes a first series resonator and a shunt circuit. The first series resonator is coupled to and disposed between the first and the second ports in series. The shunt circuit is coupled to and disposed between the first series resonator and the grounding terminal, and includes a first shunt resonator and a functional circuit connected in series with the first shunt resonator, wherein the functional circuit is formed by a conductive line structure having a first turn-back conductive line and a second turn-back conductive line connected in series with the first turn-back conductive line.

It is therefore another embodiment of the present disclosure to provide an acoustic-wave ladder filter. The acoustic-wave ladder filter has a first port, a second port and a grounding terminal, and includes a parallel circuit and a first shunt resonator. The parallel circuit is coupled to and disposed between the first port and the second port in series, and includes a branch circuit and a functional capacitor connected in parallel with the branch circuit, wherein the branch circuit includes a first series resonator, and an equivalent circuit of the first series resonator includes a static capacitor. The first shunt resonator is coupled to and disposed between the parallel circuit and the grounding terminal, wherein the static capacitor has a first capacitance value, the functional capacitor has a second capacitance value, and a ratio of the second capacitance value to the first capacitance value ranges from 0.1 to 1.0.

It is therefore another embodiment of the present disclosure to provide an acoustic-wave ladder filter. The acoustic-wave ladder filter has a first port, a second port and a grounding terminal, and includes a parallel circuit and a first shunt resonator. The parallel circuit is coupled to and disposed between the first port and the second port in series, and includes a branch circuit and a functional capacitor connected in parallel with the branch circuit. The first shunt resonator is coupled to and disposed between the parallel circuit and the grounding terminal. The branch circuit includes a first series resonator, which includes a first bus conductor and a first plurality of finger electrodes extending in a first specific direction from the first bus conductor. The functional capacitor includes a second bus conductor extending from the first bus conductor, and a second plurality of finger electrodes extending in a second specific direction from the second bus conductor, wherein the second specific direction is substantially perpendicular to the first specific direction.

BRIEF DESCRIPTION OF THE DRAWINGS

The foregoing and other features and advantages of the present disclosure will be more clearly understood through the following descriptions with reference to the drawings, wherein.

DETAIL DESCRIPTION OF THE PREFERRED EMBODIMENTS

The present disclosure will now be described more specifically with reference to the following embodiments. It is to be noted that the following descriptions of preferred embodiments of this disclosure are presented herein for the purposes of illustration and description only; they are not intended to be exhaustive or to be limited to the precise form disclosed.

Figure 1:
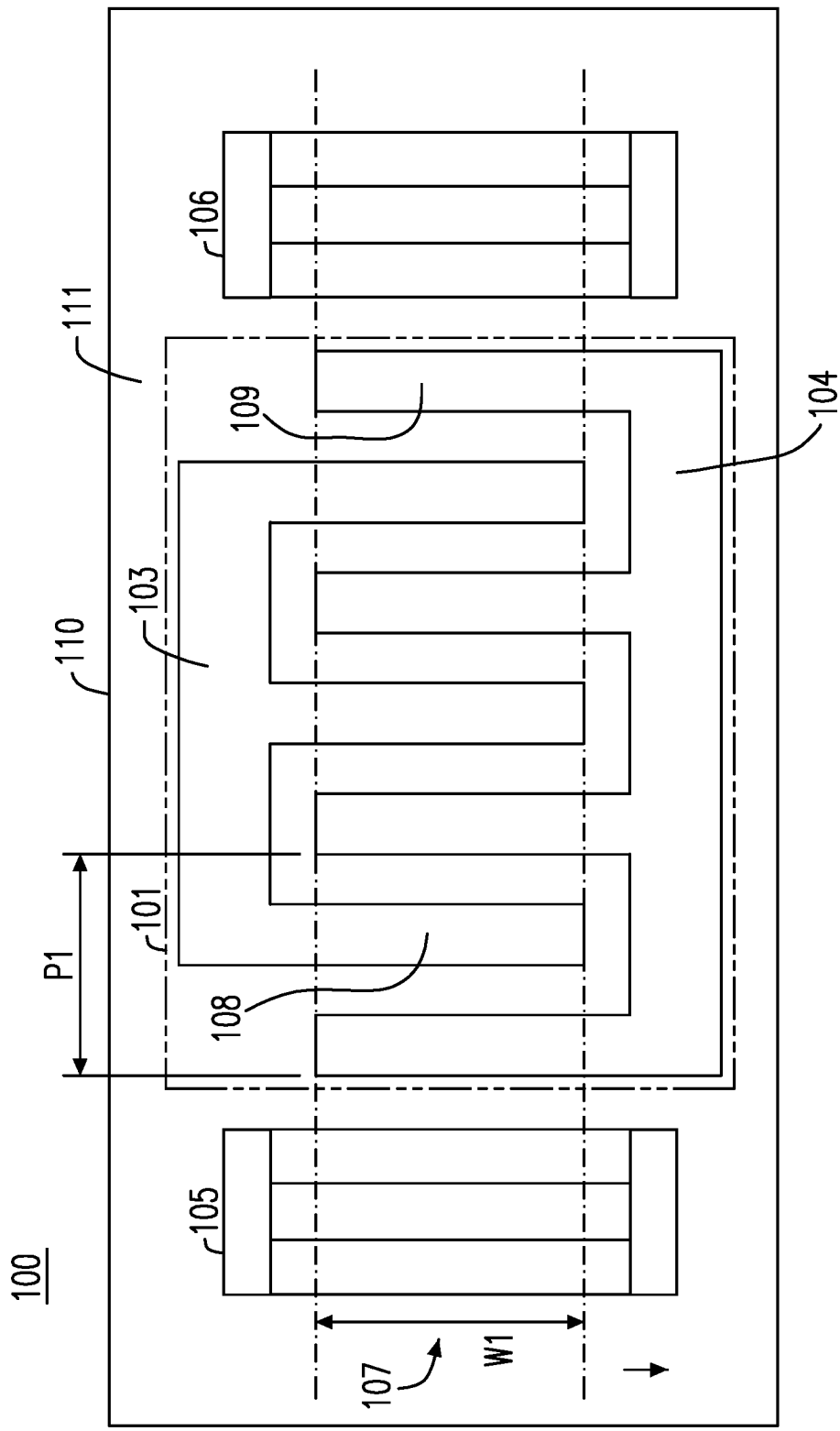
FIG. 1 is a schematic diagram showing a structure of an impedance element in the prior art.
Figure 2:
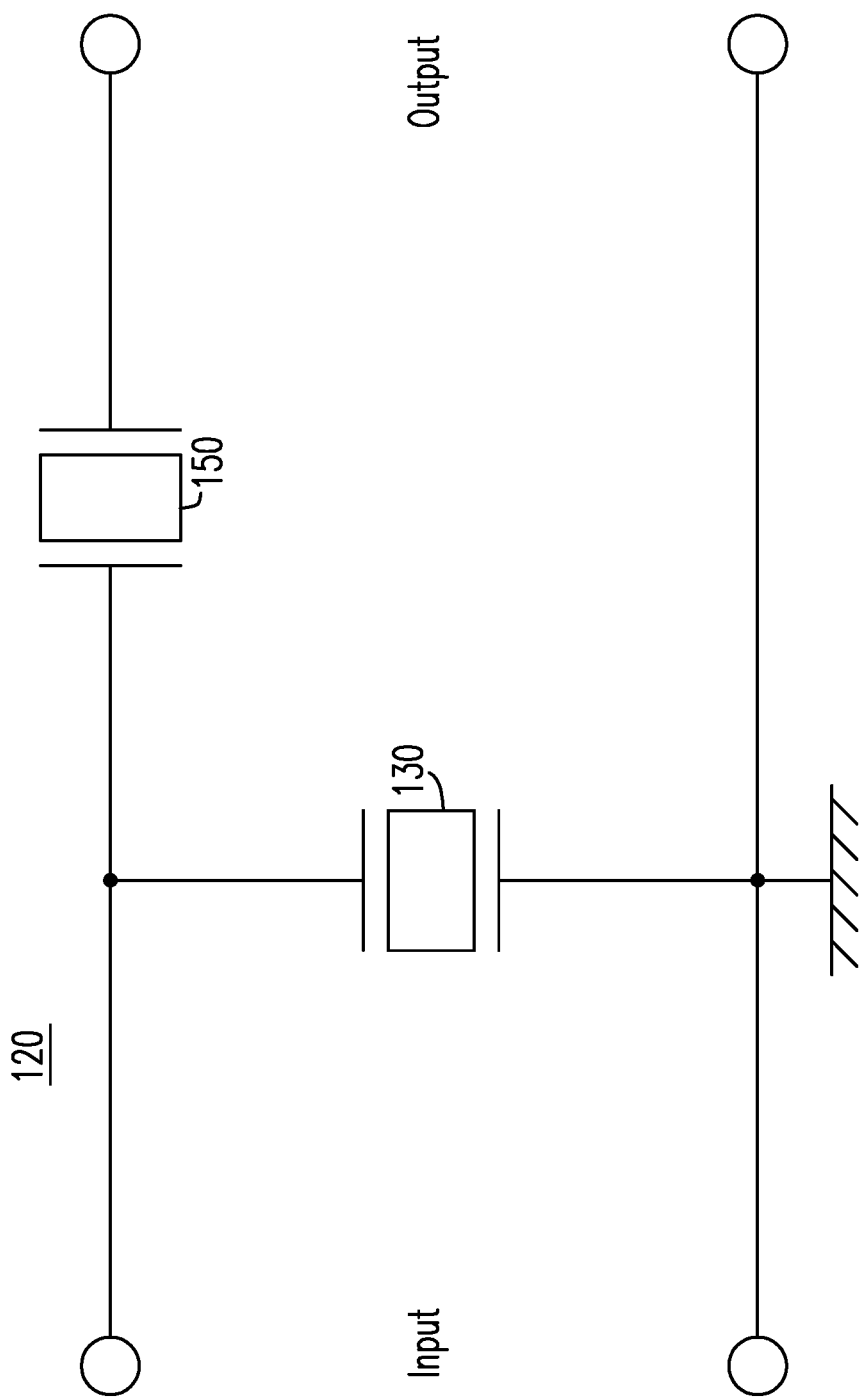
FIG. 2 is a schematic diagram showing a structure of an impedance element filter in the prior art.

In some embodiments, the series resonator 150 and the shunt resonator 130, as shown in FIG. 2, are given different resonance and anti-resonance frequencies. The shunt resonator 130 has a first variable impedance. The series resonator 150 has a second variable impedance. In the required frequency band, the second variable impedance of the series resonator 150 is equal to a relatively low impedance, and the first variable impedance of the shunt resonator 130 is equal to a relatively high impedance. In this case, an input signal of the impedance element filter 120 passes with low insertion loss.

Figure 3:
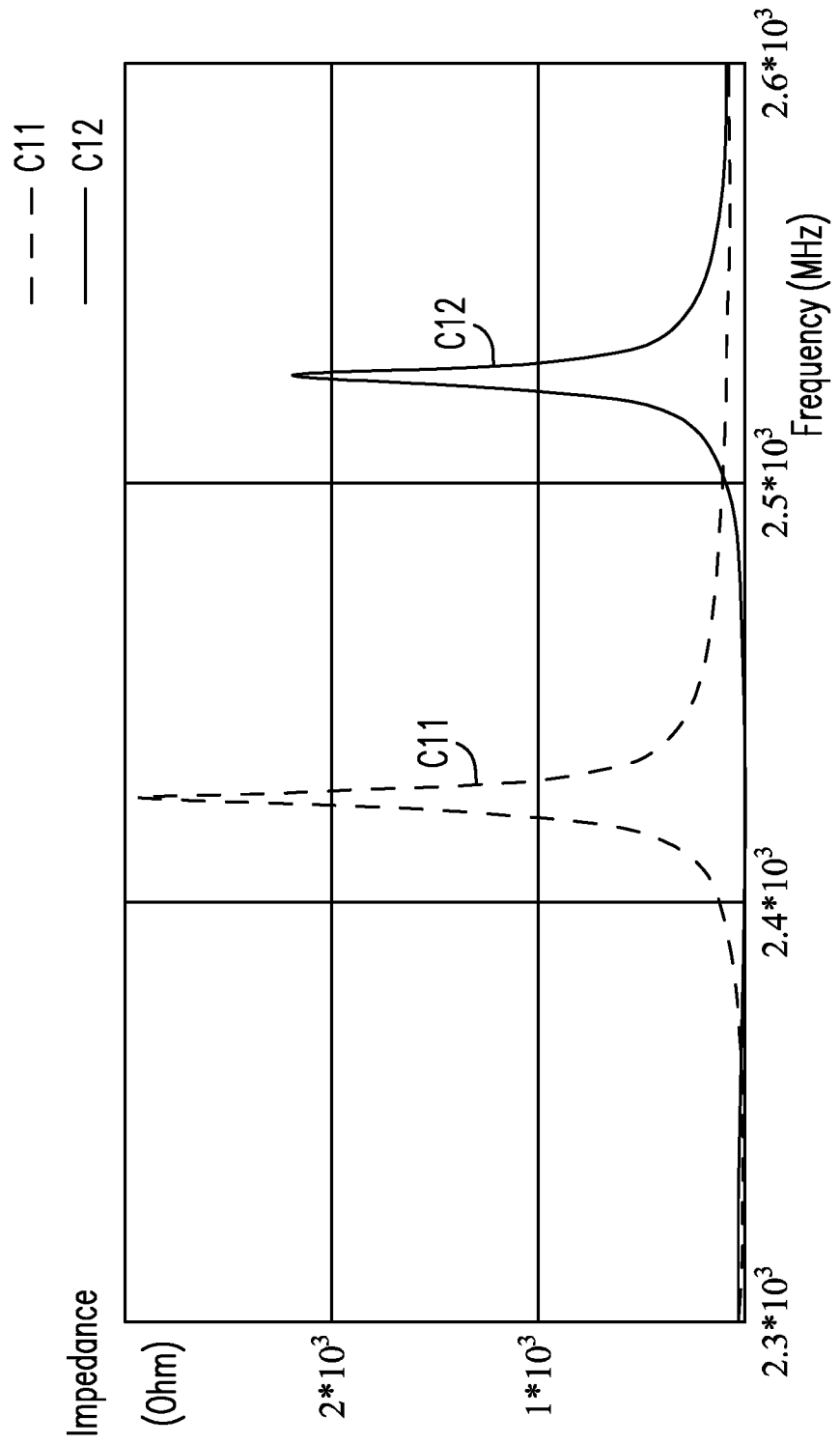
FIG. 3 is a schematic diagram showing an impedance of the impedance element filter shown in FIG. 2.

Please refer to FIG. 3, which is a schematic diagram showing an impedance of the impedance element filter 120 shown in FIG. 2. A simulation curve C11 shown in FIG. 3 represents the first variable impedance. A simulation curve C12 shown in FIG. 3 represents the second variable impedance. In the passband, the absolute value of the second variable impedance is equal to a few Ohms, and the absolute value of the first variable impedance is equal to a few hundred Ohms FIG. 3 shows a first frequency response of the shunt resonator 130, and shows a second frequency response of the series resonator 150.

Figure 4A:
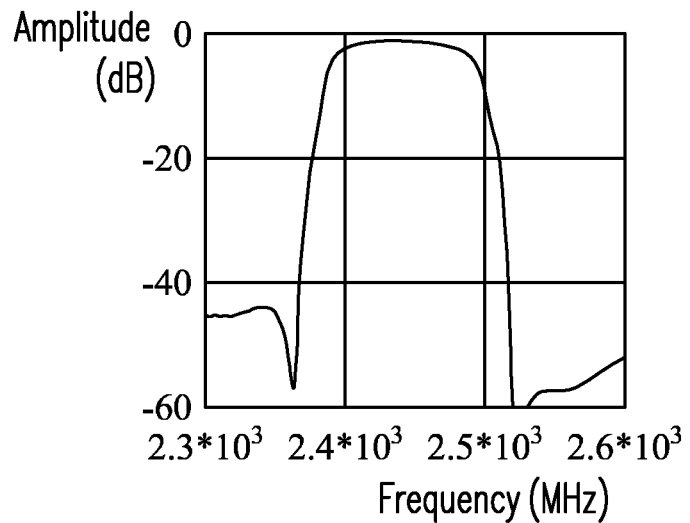
FIG. 4A is a schematic diagram showing a signal power of the impedance element filter shown in FIG. 2.
Figure 4B:
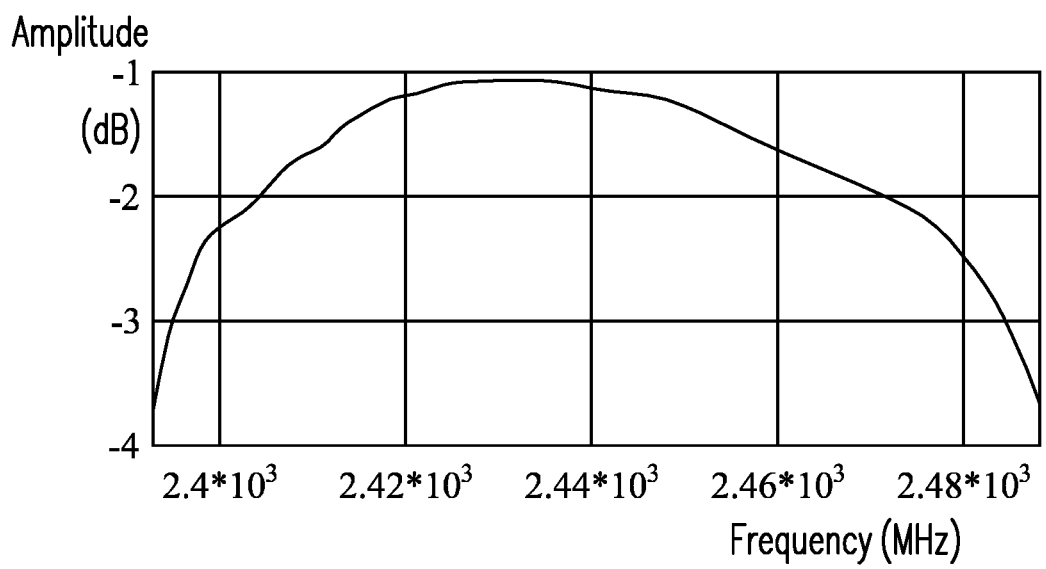
FIG. 4B is a schematic diagram showing a signal power in a specific frequency range of the signal power shown in FIG. 4A.

Please refer to FIG. 4A and FIG. 4B. FIG. 4A is a schematic diagram showing a signal power of the impedance element filter 120 shown in FIG. 2. FIG. 4B is a schematic diagram showing a signal power in a specific frequency range of the signal power shown in FIG. 4A. As shown in FIGS. 4A and 4B, under a condition that the impedance element filter 120 is operated at the frequency of 2441 MHz, the impedance element filter 120 has a small insertion loss and high rejections. Each of the shunt resonator 130 and the series resonator 150 includes an interdigital transducer; the interdigital transducer includes a bus bar; and the bus bar has a measured resistance or a resistance value. The insertion loss is dependent on the measured resistance. The measured resistance is always less than 0.5 Ohms.

Figure 5:
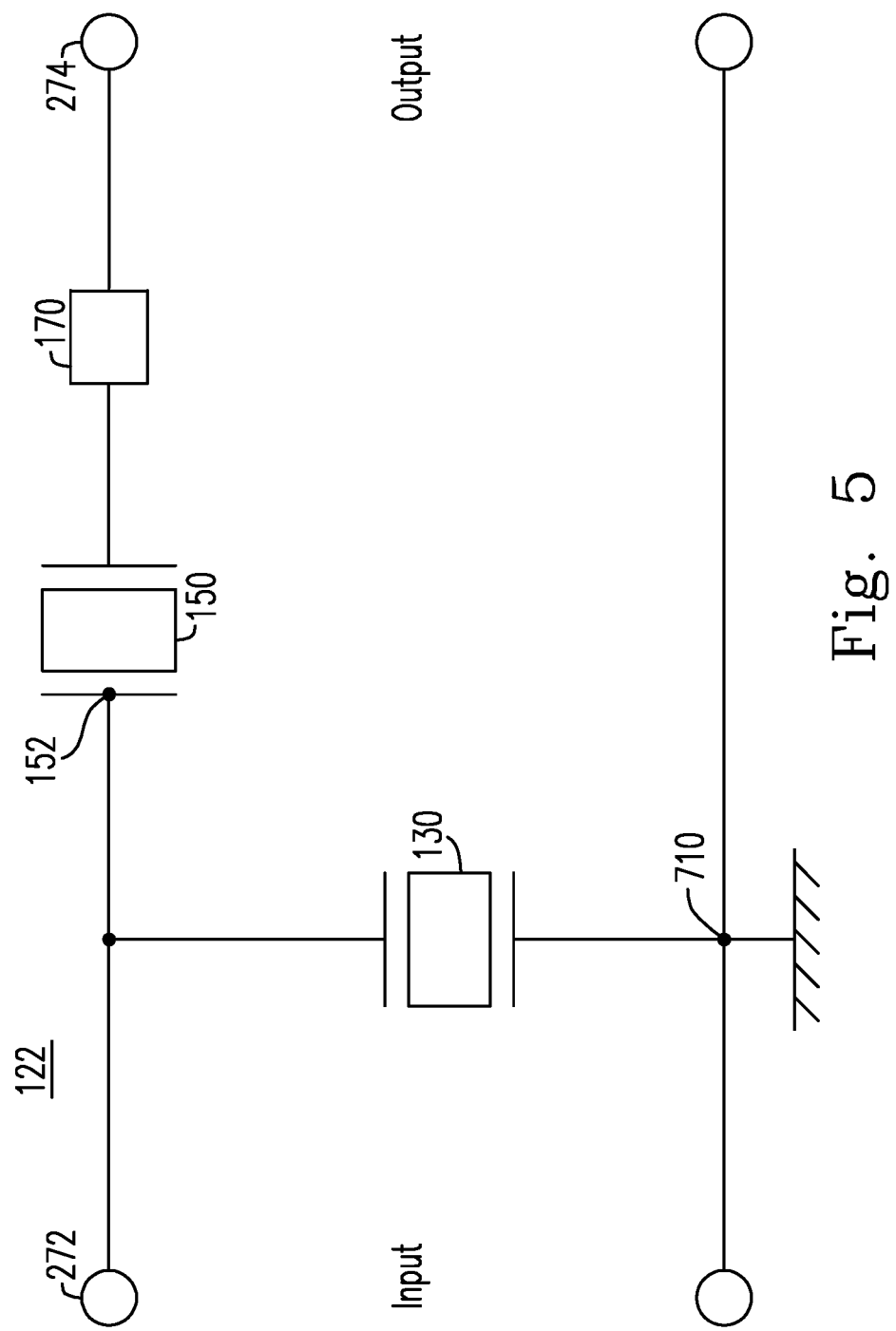
FIG. 5 is a schematic structural diagram showing an acoustic-wave ladder filter according to an embodiment of the present disclosure.

Please refer to FIG. 5, which is a schematic structural diagram showing an acoustic-wave ladder filter 122 according to an embodiment of the present disclosure. For example, the acoustic-wave ladder filter 122 is a SAW ladder filter. As shown in FIG. 5, the acoustic-wave ladder filter 122 has a first port 272, a second port 274 and a grounding terminal 710, and includes a shunt resonator 130, a series resonator 150 and a resistor 170. The series resonator 150 has a conductive terminal 152, and is coupled to and disposed between the first and the second ports 272 and 274 in series. The shunt resonator 130 is coupled to and disposed between the conductive terminal 152 and the grounding terminal 710. The resistor 170 is coupled or electrically connected between the series resonator 150 and the second port 274. For example, the resistor 170 has a measured resistance or a resistance value.

Figure 6A:
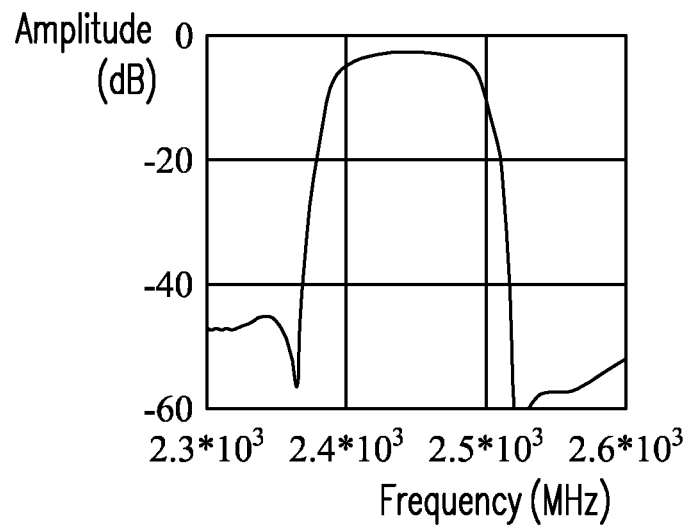
FIG. 6A is a schematic diagram showing a signal power of the acoustic-wave ladder filter shown in FIG. 5.
Figure 6B:
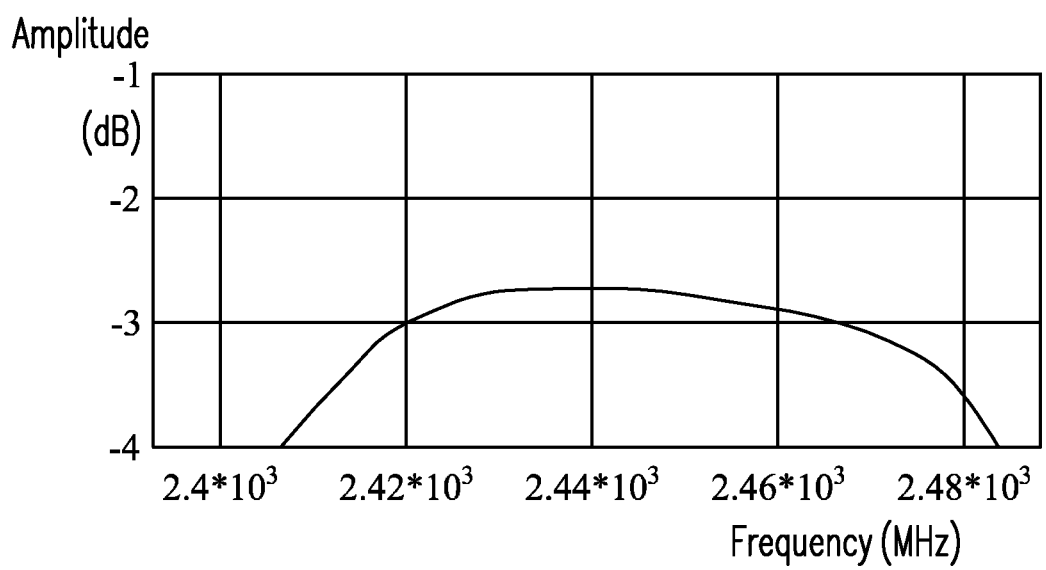
FIG. 6B is a schematic diagram showing a signal power in a specific frequency range of the signal power shown in FIG. 6A.

Please refer to FIG. 6A and FIG. 6B. FIG. 6A is a schematic diagram showing a signal power of the acoustic-wave ladder filter 122 shown in FIG. 5. FIG. 6B is a schematic diagram showing a signal power in a specific frequency range of the signal power shown in FIG. 6A. FIGS. 6A and 6B also show an insertion loss of the acoustic-wave ladder filter 122. As shown in FIGS. 6A and 6B, under a condition that the resistance value of the resistor 170 is equal to 5 Ohms, the additional insertion loss of the acoustic-wave ladder filter 122 is about equal to 1.6 dB in comparison with the insertion loss of the impedance element filter 120.

Under a condition that the resistance value of the resistor 170 is equal to 15 Ohms, the additional insertion loss of the acoustic-wave ladder filter 122 is about equal to 5 dB in comparison with the insertion loss of the impedance element filter 120. In order to reduce an insertion loss of an acoustic-wave ladder filter structure, the acoustic-wave ladder filter structure can be designed according to an electrode resistance minimization. For example, the acoustic-wave ladder filter structure can include parallel connections of resonators to reduce the insertion loss. For example, the acoustic-wave ladder filter structure has pads and bus bars. The acoustic-wave ladder filter structure can include an additional layer on the pads and the bus bars to reduce the insertion loss. It is of prime importance that the sensitivity of the filter performance to the resistance of the shunt resonator 130 is small.

Figure 7:
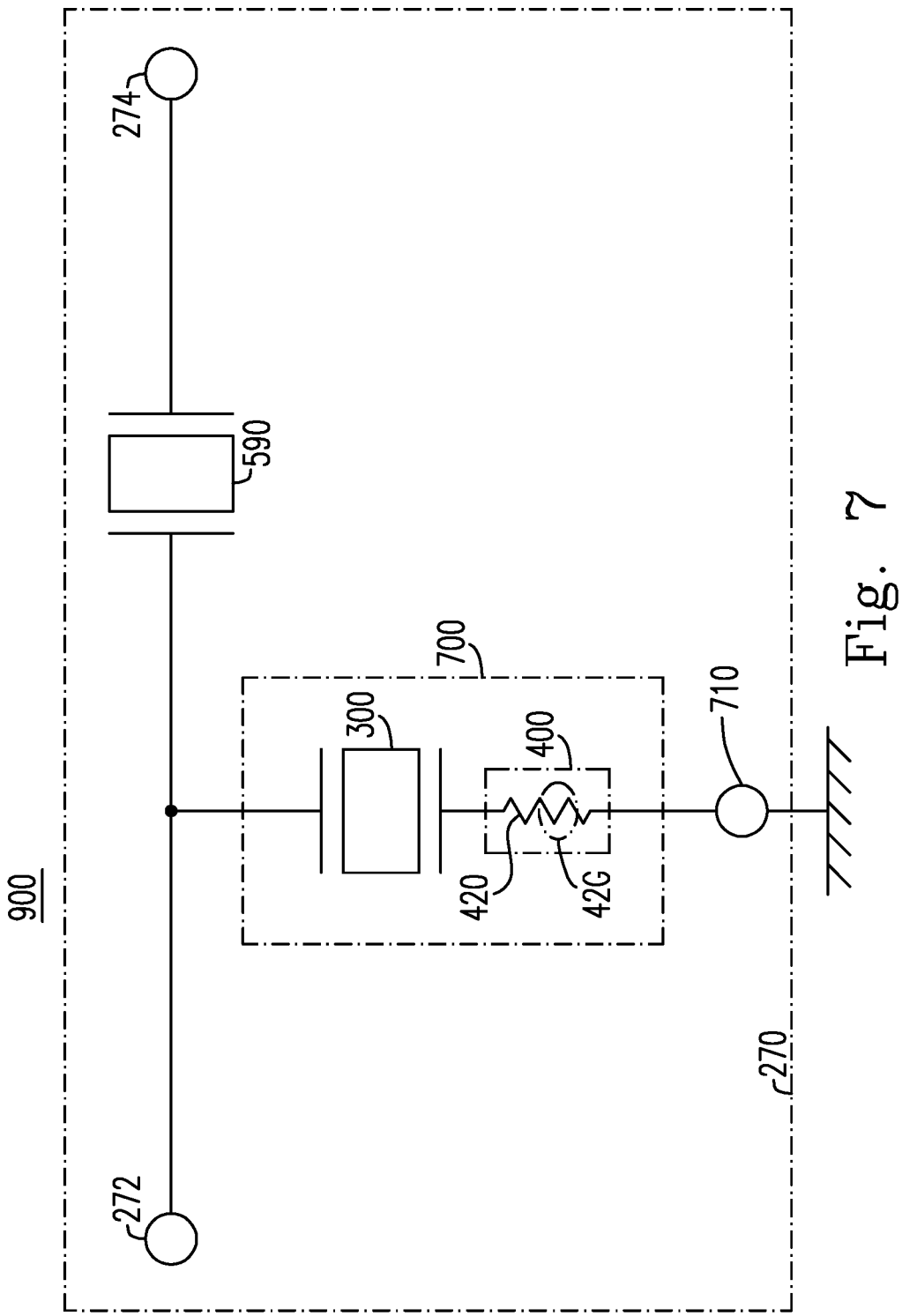
FIG. 7 is a schematic diagram showing a signal processing system according to various embodiments of the present disclosure.

Please refer to FIG. 7, which is a schematic diagram showing a signal processing system 900 according to various embodiments of the present disclosure. As shown in FIG. 7, the signal processing system 900 includes an acoustic-wave ladder filter 270. The acoustic-wave ladder filter 270 has a first port 272, a second port 274 and a grounding terminal 710, and includes a first series resonator 590 and a shunt circuit 700. The first series resonator 590 is coupled to and disposed between the first and the second ports 272 and 274 in series. The shunt circuit 700 is coupled to and disposed between the first series resonator 590 and the grounding terminal 710, and includes a first shunt resonator 300 and a functional circuit 400 connected in series with the first shunt resonator 300. For example, the functional circuit 400 includes a resistor 420 having a resistance value 42G. The resistance value 42G is greater than 5 Ohms.

Figure 8:
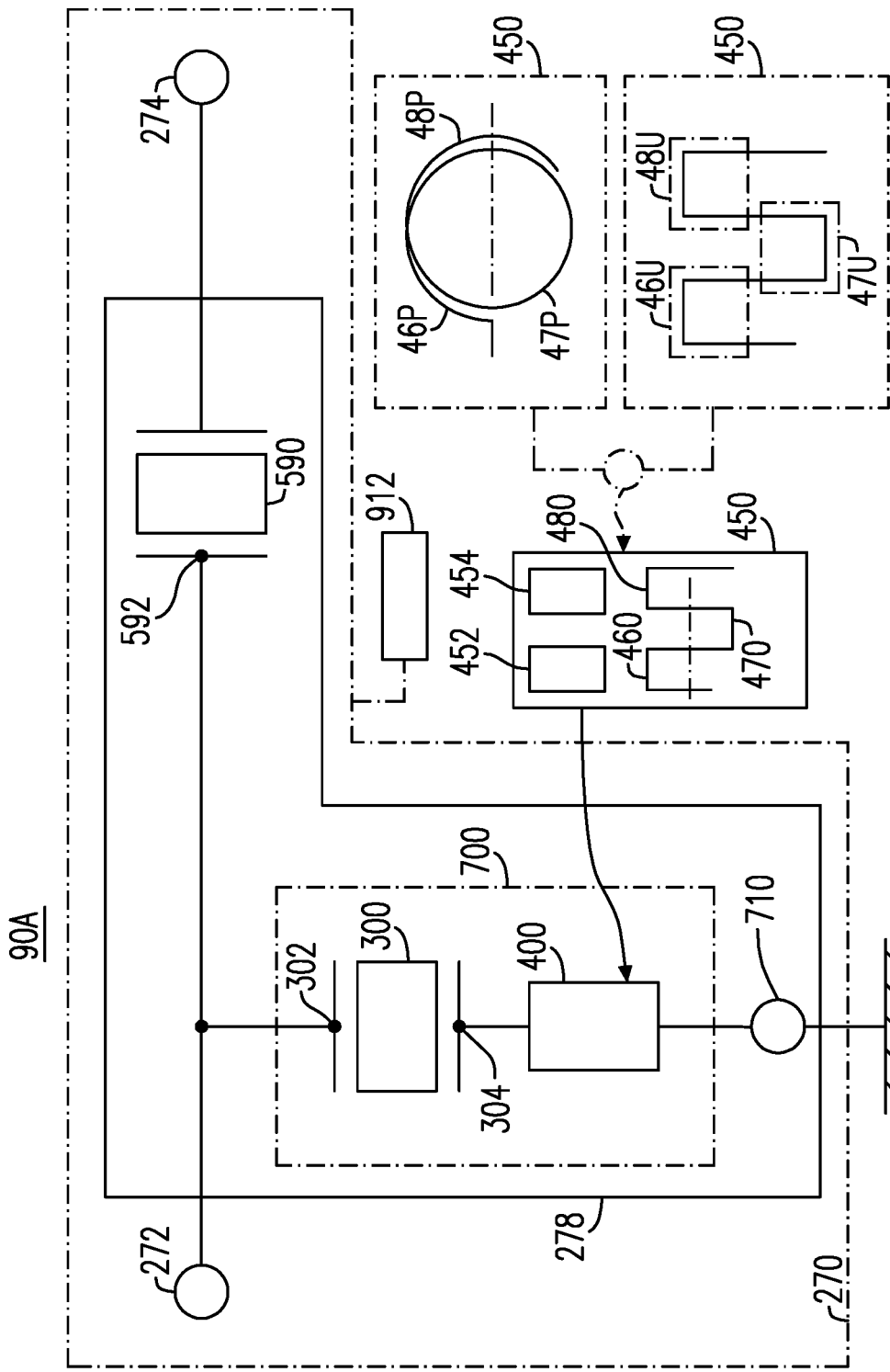
FIG. 8 is a schematic diagram showing an implementation structure of the signal processing system shown in FIG. 7.
Figure 9:
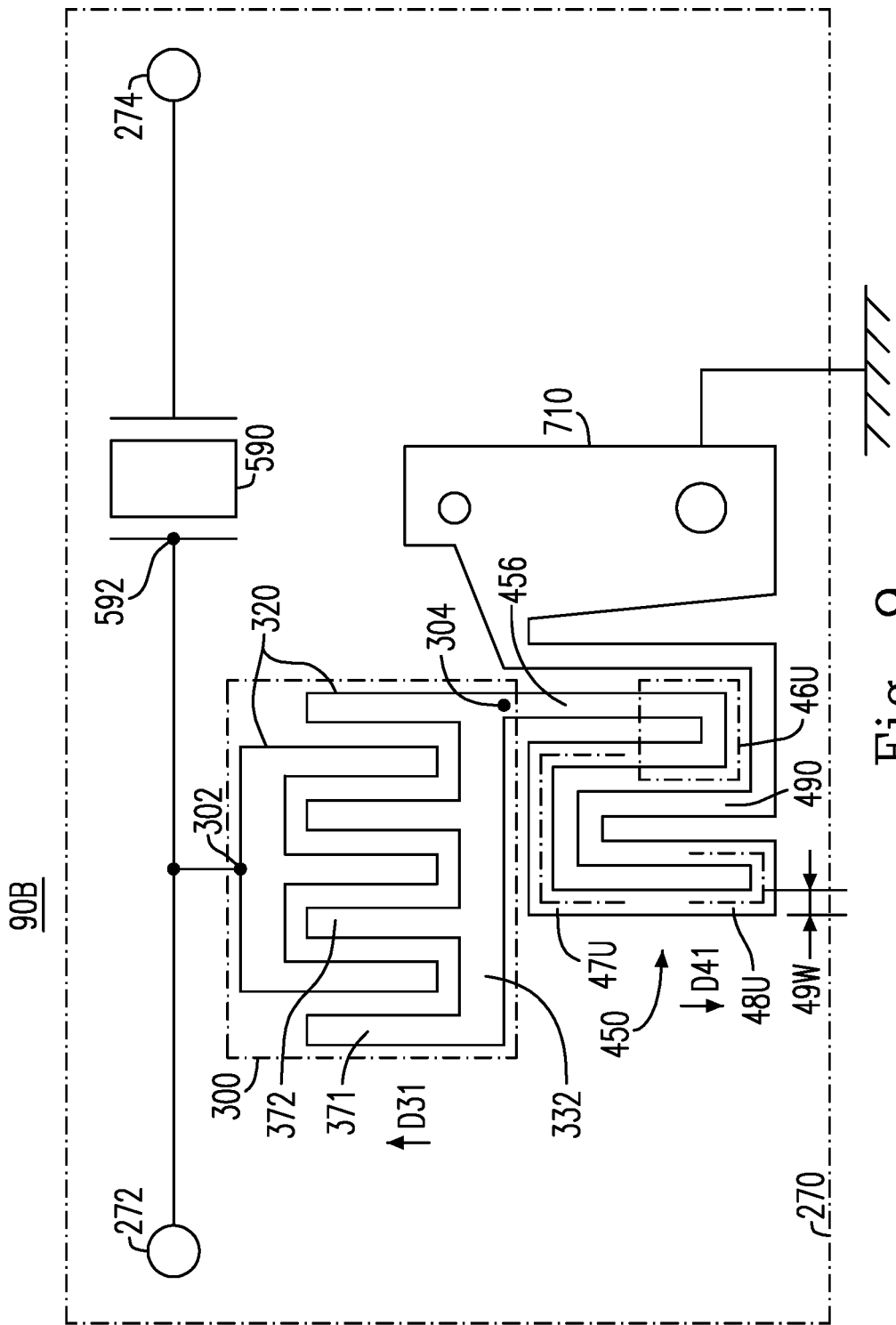
FIG. 9 is a schematic diagram showing an implementation structure of the signal processing system shown in FIG. 7.
Figure 10:
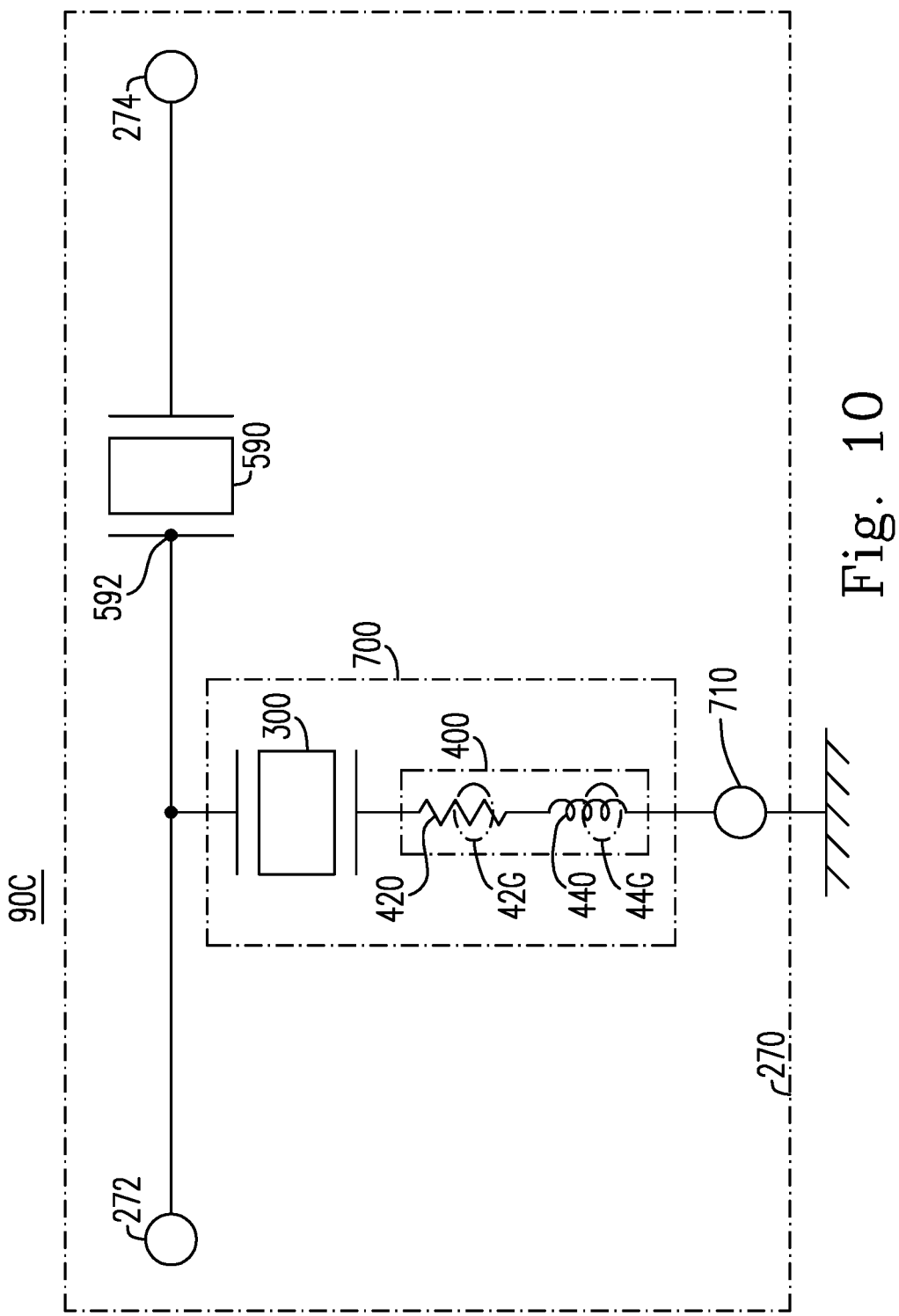
FIG. 10 is a schematic diagram showing an implementation structure of the signal processing system shown in FIG. 7.

Please refer to FIG. 8, FIG. 9 and FIG. 10. FIG. 8 is a schematic diagram showing an implementation structure 90A of the signal processing system 900 shown in FIG. 7. FIG. 9 is a schematic diagram showing an implementation structure 90B of the signal processing system 900 shown in FIG. 7. FIG. 10 is a schematic diagram showing an implementation structure 90C of the signal processing system 900 shown in FIG. 7. As shown in FIGS. 8, 9 and 10, each of the implementation structures 90A, 90B and 90C includes the acoustic-wave ladder filter 270. For example, the acoustic-wave ladder filter 270 is a surface-acoustic-wave (SAW) ladder filter. The first series resonator 590 and the first shunt resonator 300 are a SAW series resonator and a SAW shunt resonator, respectively. The functional circuit 400 is coupled to and disposed between the first shunt resonator 300 and the grounding terminal 710 in series. The first and the second ports 272 and 274 are an input port and an output port, respectively.

In some embodiments, the acoustic-wave ladder filter 270 is used for a diplexer 912, and further includes a piezoelectric substrate 278. The resistance value 42G ranges from 5 Ohms to 50 Ohms Each of the first series resonator 590, the shunt circuit 700 and the grounding terminal 710 is disposed on the piezoelectric substrate 278. The first series resonator 590 has a first conductive terminal 592 coupled to the first port 272. The first shunt resonator 300 has a second conductive terminal 302 electrically connected to the first conductive terminal 592, and a third conductive terminal 304 being opposite to the second conductive terminal 302, and includes a first interdigital transducer 320. For example, the functional circuit 400 is electrically connected between the third conductive terminal 304 and the grounding terminal 710.

The functional circuit 400 is formed by a conductive line structure 450. For example, the conductive line structure 450 has a first physical structure 452 physically forming the resistor 420, and is one selected from a group consisting of a bifilar coil, an incorporated meander coil and a strip line coil. The conductive line structure 450 includes a first turn-back conductive line 460 and a second turn-back conductive line 470 connected in series with the first turn-back conductive line 460. For example, the first turn-back conductive line 460 is one of a first U-shaped conductive line 46U and a first half-turn conductive line 46P. The second turn-back conductive line 470 is one of a second U-shaped conductive line 47U and a second half-turn conductive line 47P. For example, the conductive line structure 450 further includes a third turn-back conductive line 480 connected in series with the second turn-back conductive line 470. The third turn-back conductive line 480 is one of a third U-shaped conductive line 48U and a third half-turn conductive line 48P.

In some embodiments, the first shunt resonator 300, the grounding terminal 710 and the functional circuit 400 have the same material, and are formed simultaneously. The first interdigital transducer 320 includes a bus bar 332, and a plurality of metal electrodes 371, 372, . . . extending in a first extension direction D31 from the bus bar 332, and has the third conductive terminal 304 directly electrically connected with the conductive line structure 450. The conductive line structure 450 includes a conductive line segment 456 extending in a second extension direction D41 from the third conductive terminal 304. For example, the second extension direction D41 is substantially parallel with the first extension direction D31. The first U-shaped conductive line 46U extends from the conductive line segment 456. The first interdigital transducer 320 further has the second conductive terminal 302.

The functional circuit 400 further includes an inductor 440 connected in series with the resistor 420. For example, the inductor 440 has an inductance value 44G. The inductance value 44G is less than 2 nano Henries (nH). The conductive line structure 450 further has a second physical structure 454 physically forming the inductor 440, and includes a relatively narrow conductive line 490 having a width 49W. For example, the width 49W ranges from 2 μm to 20 μm. The first series resonator 590, the shunt circuit 700 and the grounding terminal 710 is deposited on the piezoelectric substrate 278 by using a metal. For example, the piezoelectric substrate 278 is a SAW die. The acoustic-wave ladder filter 270 is used for the diplexer 912. For example, the diplexer 912 includes the acoustic-wave ladder filter 270.

Figure 11:
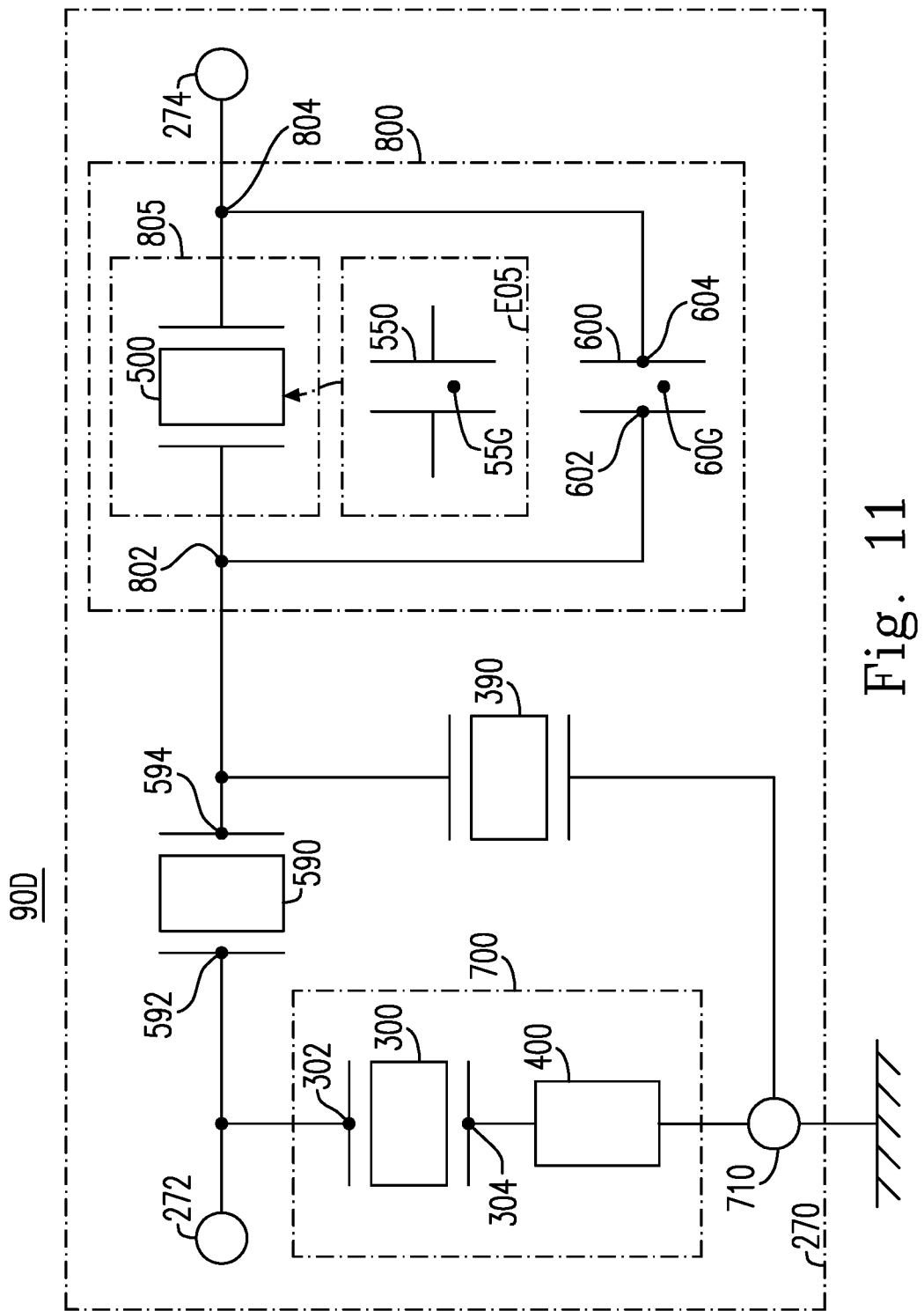
FIG. 11 is a schematic diagram showing an implementation structure of the signal processing system shown in FIG. 7.
Figure 12:
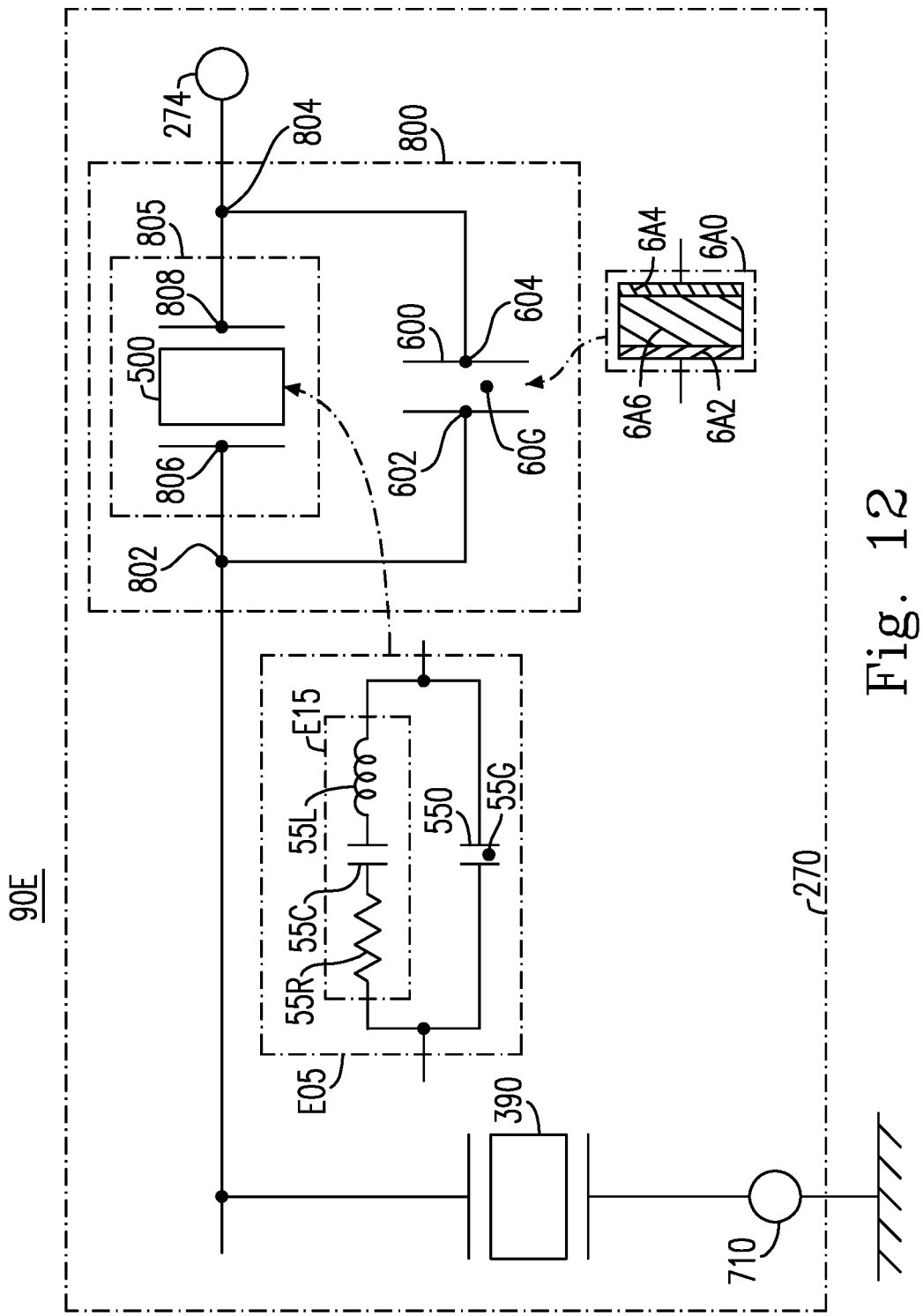
FIG. 12 is a schematic diagram showing an implementation structure of the signal processing system shown in FIG. 7.
Figure 13:
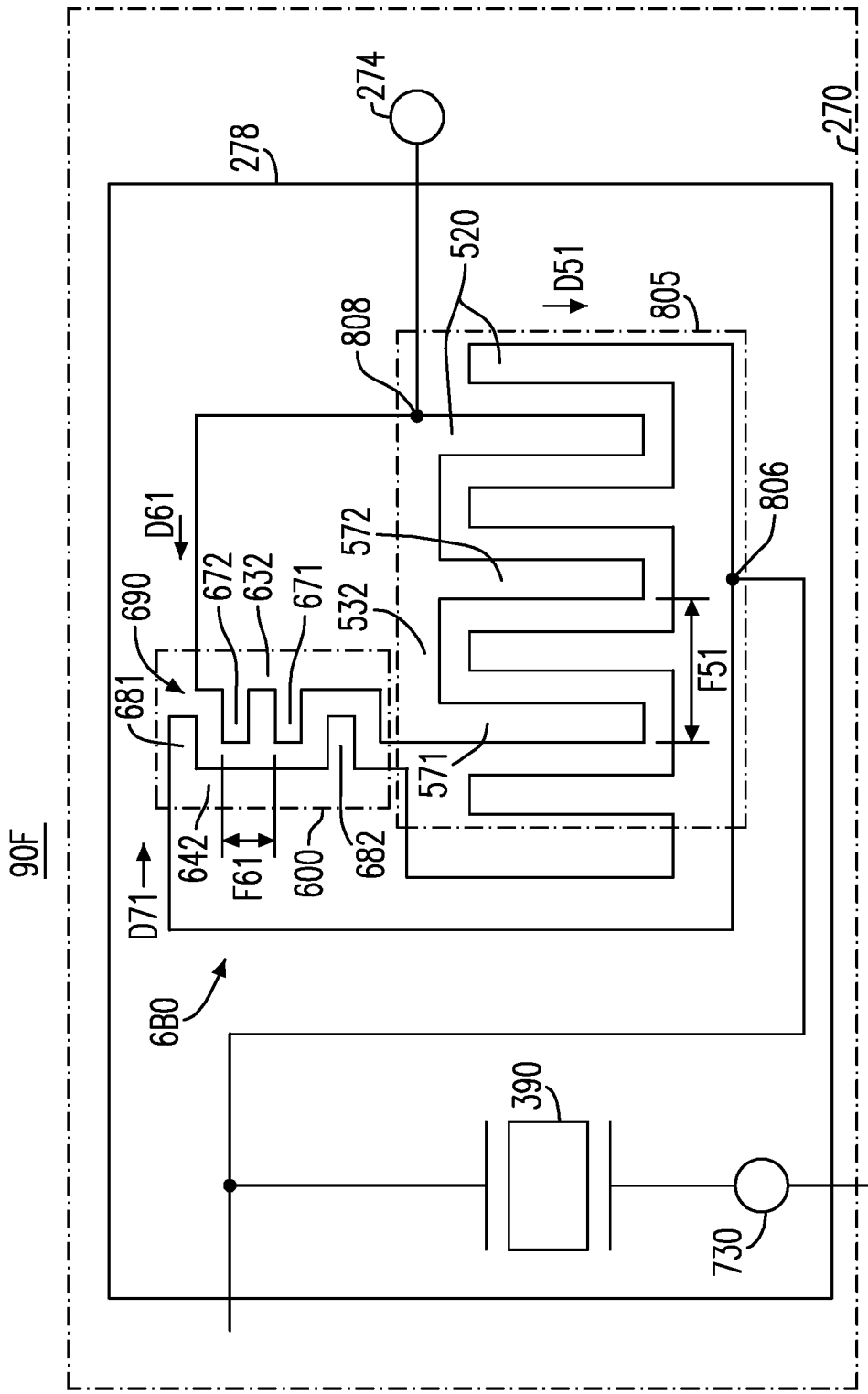
FIG. 13 is a schematic diagram showing an implementation structure of the signal processing system shown in FIG. 7.

Please refer to FIG. 11, FIG. 12 and FIG. 13. FIG. 11 is a schematic diagram showing an implementation structure 90D of the signal processing system 900 shown in FIG. 7. FIG. 12 is a schematic diagram showing an implementation structure 90E of the signal processing system 900 shown in FIG. 7. FIG. 13 is a schematic diagram showing an implementation structure 90F of the signal processing system 900 shown in FIG. 7. As shown in FIGS. 11, 12 and 13, each of the implementation structures 90D, 90E and 90F includes the acoustic-wave ladder filter 270.

In some embodiments, the first series resonator 590 further has a fourth conductive terminal 594 being opposite to the first conductive terminal 592. For example, the fourth conductive terminal 594 is coupled to the second port 274. The acoustic-wave ladder filter 270 further includes a parallel circuit 800 and a second shunt resonator 390 coupled to and disposed between the fourth conductive terminal 594 and the grounding terminal 710. The parallel circuit 800 is coupled to and disposed between the fourth conductive terminal 594 and the second port 274 in series, and includes a functional capacitor 600 and a branch circuit 805 connected in parallel with the functional capacitor 600. The branch circuit 805 includes a second series resonator 500. For example, the functional capacitor 600 includes a capacitor terminal 602 and a capacitor terminal 604 being opposite to the capacitor terminal 602. The second series resonator 500 is coupled or electrically connected between the capacitor terminal 602 and the capacitor terminal 604 in series. The parallel circuit 800 has a circuit terminal 802 electrically connected to the fourth conductive terminal 594, and a circuit terminal 804 being opposite to the circuit terminal 804. The circuit terminal 804 is coupled to the second port 274.

An equivalent circuit E05 of the second series resonator 500 includes a static capacitor 550. For example, the static capacitor 550 has a first capacitance value 55G. The functional capacitor 600 has a second capacitance value 60G. A ratio of the second capacitance value 60G to the first capacitance value 55G ranges from 0.1 to 1.0. The functional capacitor 600 is formed by one of a first capacitor structure 6A0 and a second capacitor structure 6B0. The first capacitor structure 6A0 includes a first metal layer 6A2, a second metal layer 6A4 being opposite to the first metal layer 6A2, and a dielectric layer 6A6 disposed between the first and the second metal layers 6A2 and 6A4. For example, the equivalent circuit E05 further includes a branch circuit E15. The branch circuit E15 includes a dynamic resistor 55R, a dynamic capacitor 55C and a dynamic inductor 55L. The dynamic resistor 55R, the dynamic capacitor 55C and the dynamic inductor 55L are electrically connected in series.

In some embodiments, the second series resonator 500 includes a second interdigital transducer 520. The second interdigital transducer 520 includes a first bus conductor 532 and a first plurality of finger electrodes 571, 572, . . . extending in a first specific direction D51 from the first bus conductor 532. The functional capacitor 600 includes a second bus conductor 632 extending from the first bus conductor 532, a second plurality of finger electrodes 671, 672, . . . extending in a second specific direction D61 from the second bus conductor 632, a third bus conductor 642 being opposite to the second bus conductor 632, and a third plurality of finger electrodes 681, 682, . . . extending in a third specific direction D62 being opposite to the second specific direction D61 from the third bus conductor 642. For example, the second specific direction D61 is substantially perpendicular to the first specific direction D51. The second plurality of finger electrodes 671, 672, . . . and the third plurality of finger electrodes 681, 682, . . . constitute a fourth plurality of finger electrodes 690. For example, the acoustic-wave ladder filter 270 includes a grounding terminal 730. The grounding terminal 730 is the grounding terminal 710, or is electrically connected to the grounding terminal 710.

The second series resonator 500 and the functional capacitor 600 have the same material, and are formed simultaneously. For example, the second capacitor structure 6B0 includes the fourth plurality of finger electrodes 690. The first plurality of finger electrodes 571, 572, . . . are disposed according to a first preset electrode pitch F51. The fourth plurality of finger electrodes 690 are disposed according to a second preset electrode pitch F61. For example, the second preset electrode pitch F61 is less than the first preset electrode pitch F51, or a ratio of the second preset electrode pitch F61 to the first preset electrode pitch F51 is less than 0.7. The fourth plurality of finger electrodes 690 are arranged to form one of a equal-distance electrode distribution and a non-equal-distance electrode distribution, and includes a first finger electrode 671 and a second finger electrode 672 adjacent to the first finger electrode 671. For example, the first and the second finger electrodes 671 and 672 have the same voltage polarity. The second series resonator 500 and the functional capacitor 600 are simultaneously formed on the piezoelectric substrate 278.

Figure 14:
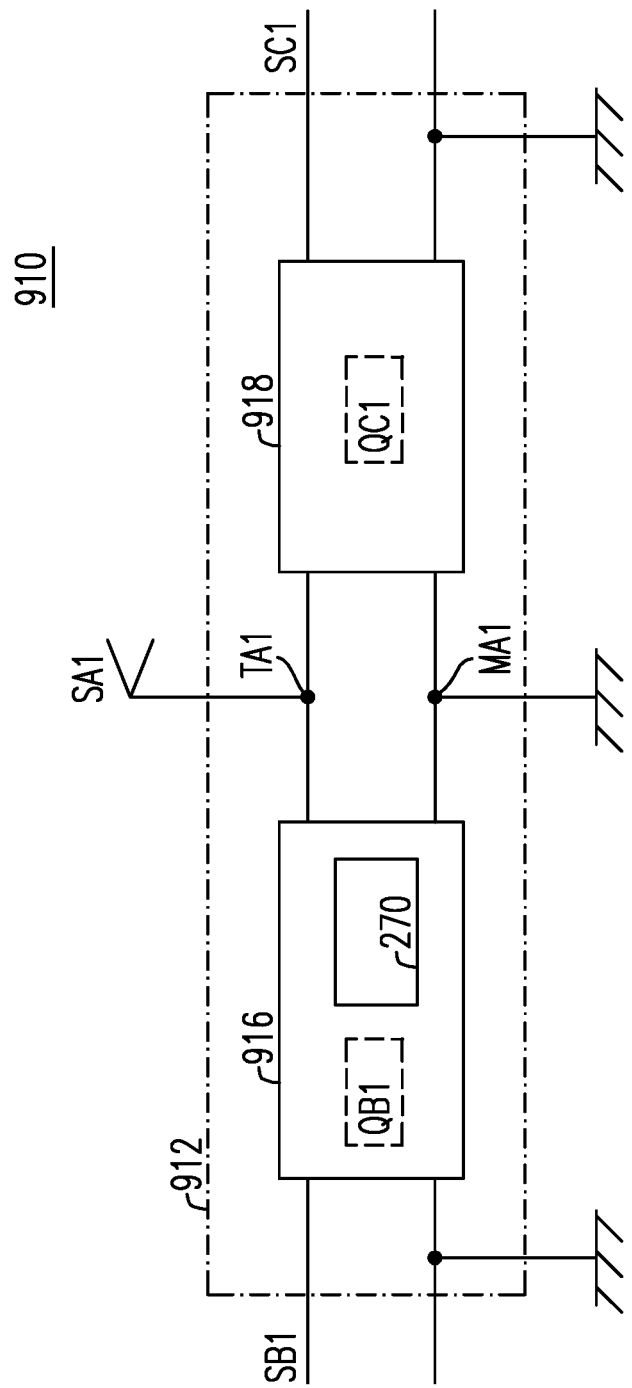
FIG. 14 is a schematic diagram showing a signal processing system according to various embodiments of the present disclosure.

Please refer to FIG. 14, which is a schematic diagram showing a signal processing system 910 according to various embodiments of the present disclosure. As shown in FIG. 14, the signal processing system 910 includes a diplexer 912. The diplexer 912 includes a common input terminal TA1, a grounding terminal MA1, a bandpass filter 916 and a notch filter 918. Each of the bandpass filter 916 and the notch filter 918 is electrically connected to the grounding terminal MAL The common input terminal TA1 receives an input signal SAL The bandpass filter 916 includes the acoustic-wave ladder filter 270, and performs a bandpass filtering operation QB1 in response to the input signal SA1 to generate an output signal SB1.

The notch filter 918 performs a rejection filtering operation QC1 in response to the input signal SA1 to generate an output signal SC1. For example, the bandpass filter 916 performs the bandpass filtering operation QB1 by using the acoustic-wave ladder filter 270. For example, the acoustic-wave ladder filter 270 is coupled to the notch filter 918, and is used to cause the diplexer 912 to meet a predetermined product specification of the diplexer 912. The bandpass filter 916 and the notch filter 918 are two acoustic-wave ladder filters or two surface-acoustic-wave ladder filters, respectively. For example, the diplexer 912 is a wireless network application device (or a Wi-Fi device) used to perform a diplex function.

Figure 15:
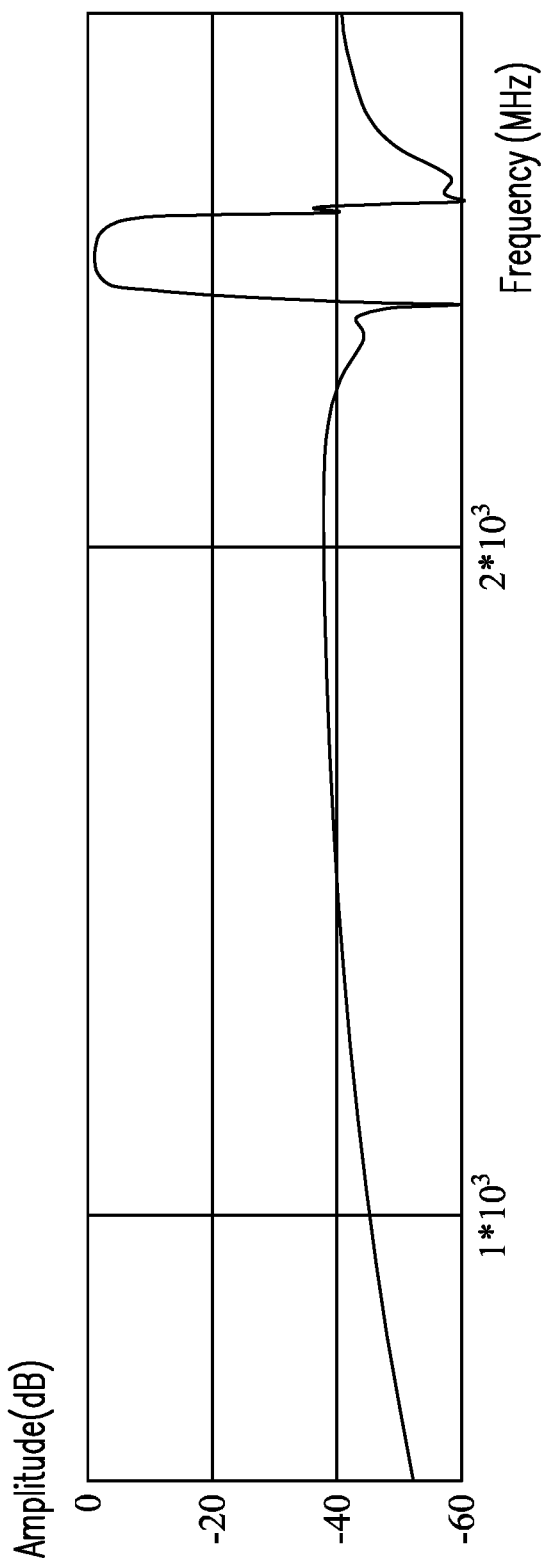
FIG. 15 is a schematic diagram showing a signal power of the bandpass filter shown in FIG. 14.
Figure 16:
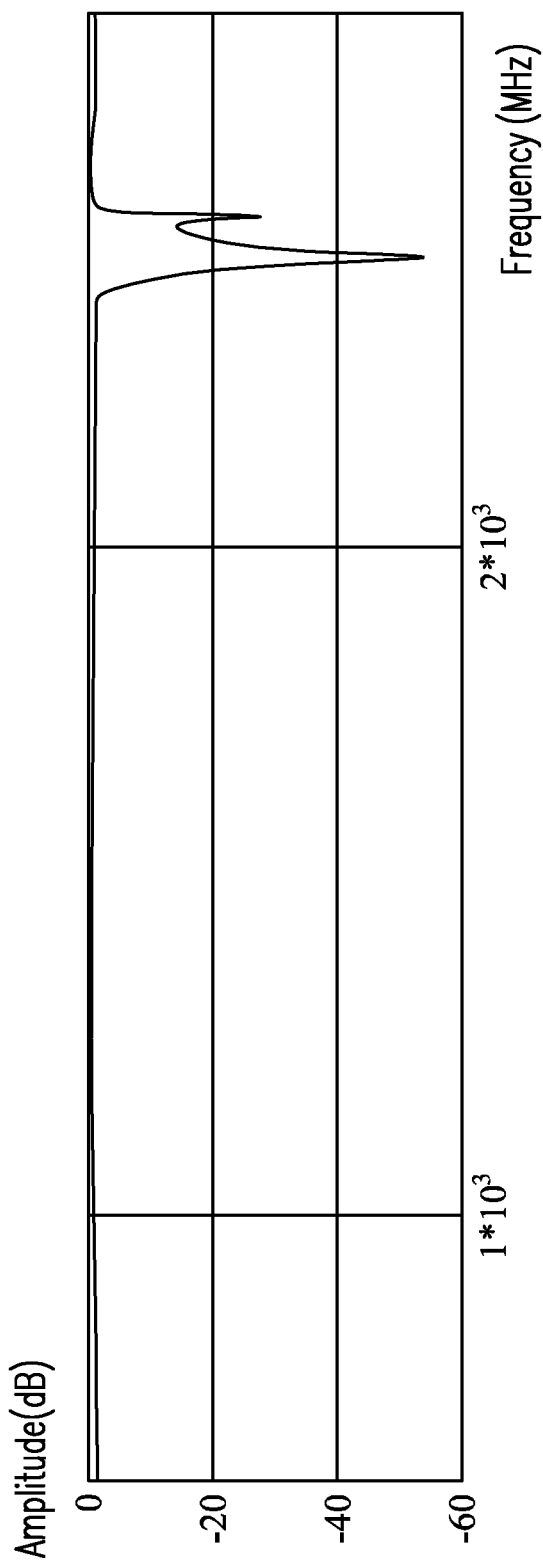
FIG. 16 is a schematic diagram showing a signal power of the notch filter shown in FIG. 14.

Please refer to FIG. 15 and FIG. 16. FIG. 15 is a schematic diagram showing a signal power of the bandpass filter 916 shown in FIG. 14. FIG. 16 is a schematic diagram showing a signal power of the notch filter 918 shown in FIG. 14. Under a condition that a ratio of the second capacitance value 60G to the first capacitance value 55G is equal to 0.5, the bandpass filter 916 has a performance as shown in FIG. 15. The diplexer 912 is used to form a first channel and a second channel. As shown in FIG. 15, the bandpass filter 916 is used to form the first channel.

As shown in FIG. 16, the notch filter 918 is used to form the second channel. The rejection band of the notch filter 918 corresponds to the pass band of the bandpass filter 916. The bandpass filter 916 and the notch filter 918 have an electric interaction therebetween, thereby affecting the first and the second channels. Unfortunately, the bandpass filter 916 creates a deep attenuation at the frequency of 2355 MHz in the second channel due to the electric interaction. The reason thereof is that the impedance of the first shunt resonator 300 at the resonance frequency is about equal to 1 Ohm, as shown in FIG. 3.

Figure 17:
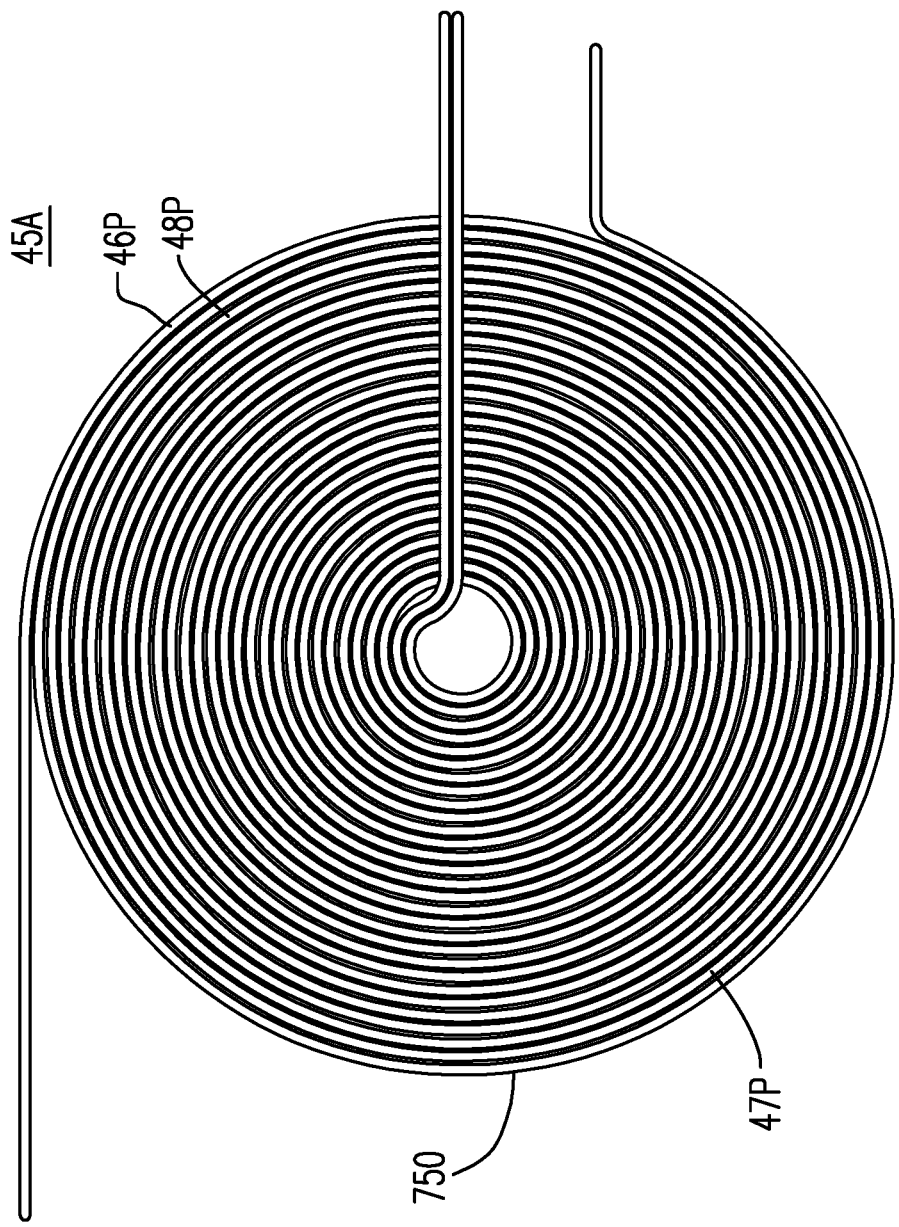
FIG. 17 is a schematic diagram showing an implementation structure of the conductive line structure shown in FIG. 8.

Please refer to FIG. 17, which is a schematic diagram showing an implementation structure 45A of the conductive line structure 450 shown in FIG. 8. The resistor 420 of the functional circuit 400 can be realized by forming a relatively high resistance layer on the piezoelectric substrate 278. As shown in FIG. 17, the conductive line structure 450 used to form the functional circuit 400 includes a bifilar coil 750. For example, the bifilar coil 750 is one of a specific bifilar coil and a Nikola Tesla's bifilar coil, is formed on the piezoelectric substrate 278, and forms the resistor 420. The advantage of the bifilar coil 75 is that the bifilar coil 75 has a smallest inductance. The bifilar coil 75 includes the first half-turn conductive line 46P, the second half-turn conductive line 47P and the third half-turn conductive line 48P connected in series with the second half-turn conductive line 47P.

Figure 18:
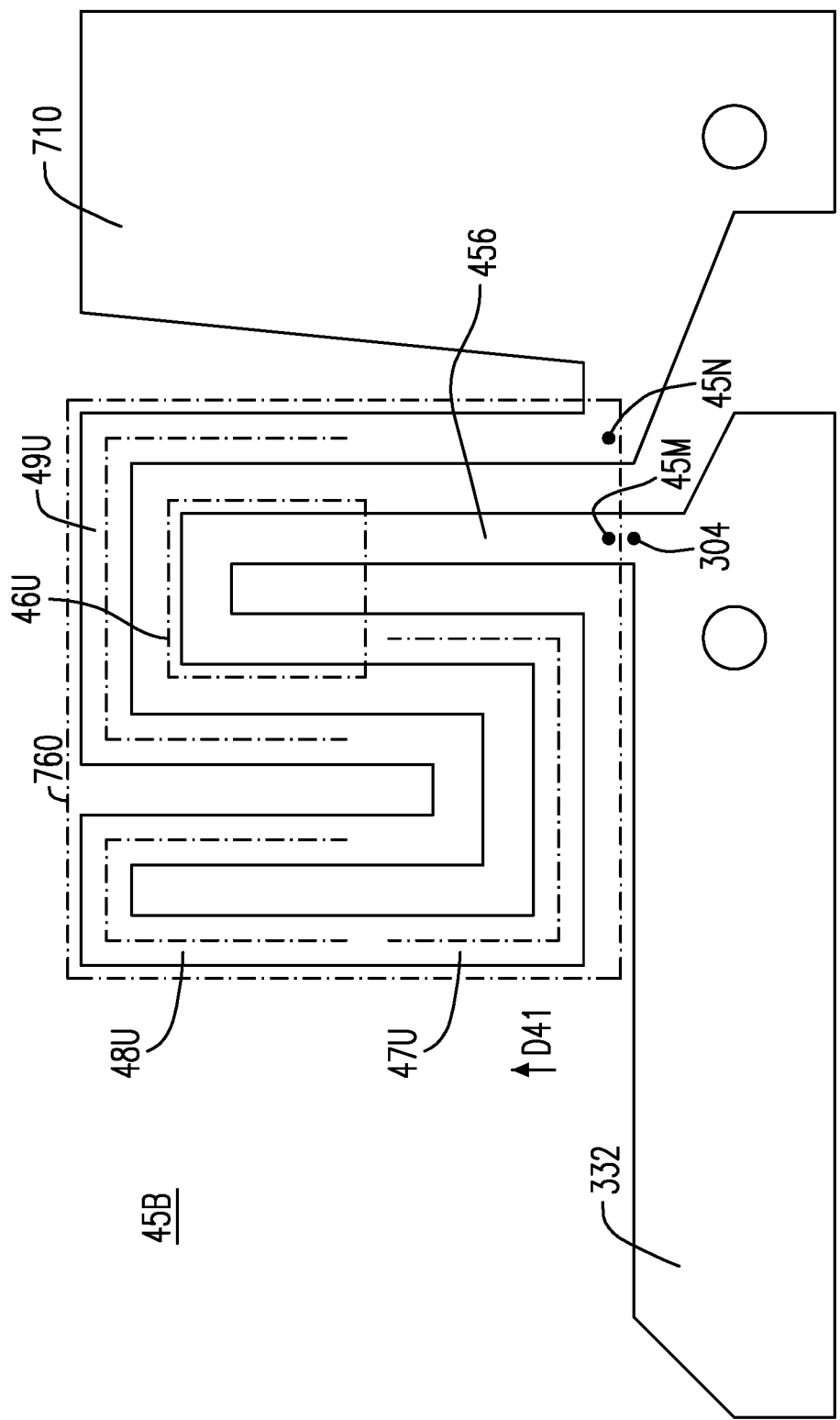
FIG. 18 is a schematic diagram showing an implementation structure of the conductive line structure shown in FIG. 8.

Please refer to FIG. 18, which is a schematic diagram showing an implementation structure 45B of the conductive line structure 450 shown in FIG. 8. As shown in FIG. 18, the conductive line structure 450 used to form the functional circuit 400 includes an incorporated meander coil 760. For example, the conductive line structure 450 has a conductive terminal 45M and a conductive terminal 45N being opposite to the conductive terminal 45M. The conductive terminal 45M is directly connected to the third conductive terminal 304. The conductive terminal 45N is directly connected to the grounding terminal 710. The incorporated meander coil 760 includes the first U-shaped conductive line 46U, the second U-shaped conductive line 47U and the third U-shaped conductive line 48U connected in series with the second U-shaped conductive line 47U. The advantage of the incorporated meander coil 760 is in the smaller size and compensation of the magnetic field due to different current direction in neighboring meander electrodes.

In some embodiments, the conductive line structure 450 is a coil structure, further includes a U-shaped conductive line 49U coupled to and disposed between the third U-shaped conductive line 48U and the grounding terminal 710 in series, and is used to form the resistor 420 and the inductor 440 connected in series with the resistor 420. The U-shaped conductive line 49U forms an inner region. The first U-shaped conductive line 46U is at least partly disposed in the inner region. The inductor 440 has the inductance value 44G or a measured inductance. The output signal SB1 of the bandpass filter 916 and the output signal SC1 of the notch filter 918 are analyzed to obtain an analysis result. The analysis result shows that under a condition that the inductance value 44G is less than 2 nH, the inductor 440 is used to improve the rejection of the notch filter 918 and to increase the bandwidth of the bandpass filter 916.

Figure 19:
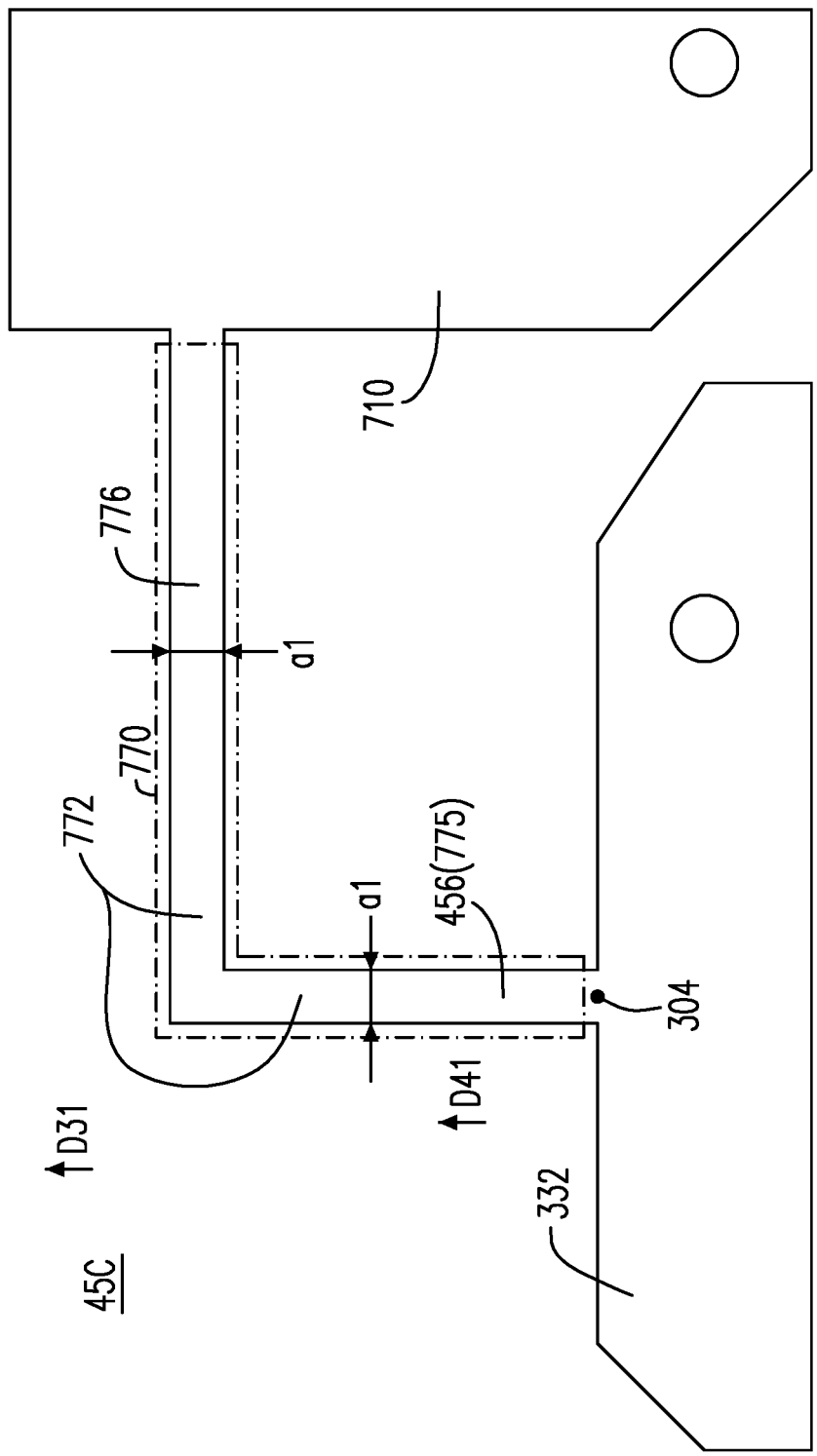
FIG. 19 is a schematic diagram showing an implementation structure of the conductive line structure shown in FIG. 8.

Please refer to FIG. 19, which is a schematic diagram showing an implementation structure 45C of the conductive line structure 450 shown in FIG. 8. As shown in FIG. 19, the conductive line structure 450 used to form the functional circuit 400 includes a strip line 770. For example, the strip line 770 includes an L-shaped conductive line 772. The L-shaped conductive line 772 includes a conductive straight line 775 and a conductive straight line 776 being substantially perpendicular to the conductive straight line 775. For example, the material of the strip line 770 is aluminum.

Under a condition that the width of the strip line 770 is equal to 8 microns and the total length of the strip line 770 is equal to 240 microns, the strip line 770 has 30 squares. A SAW filter operated at the frequency of 2441 MHz has an optimal metal thickness, which is about equal to 120 nm (aluminum material). In this case, the normalized resistivity is equal to 0.3 Ohm/□ and the total line resistance R=9 Ohms. The inductance of the inductor 440 can be estimated by the following formula: 0.048 ln(8h/a1), wherein a1 is the line width, and h is the thickness of the metal formed on the piezoelectric substrate 278. The inductance value 44G of the inductor 440 is about equal to 0.11 nH.

Figure 20:
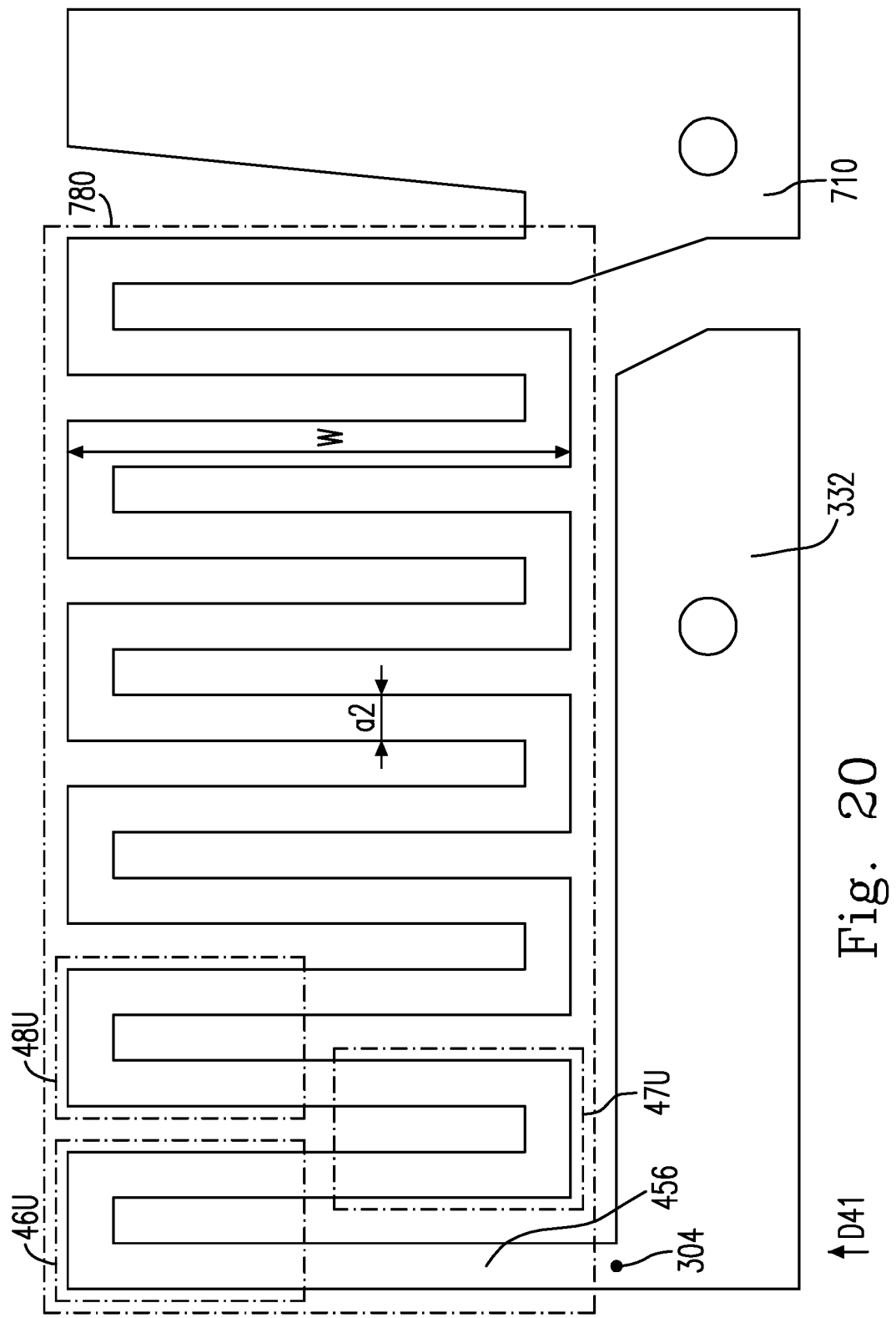
FIG. 20 is a schematic diagram showing an implementation structure of the conductive line structure shown in FIG. 8.

Please refer to FIG. 20, which is a schematic diagram showing an implementation structure 45D of the conductive line structure 450 shown in FIG. 8. As shown in FIG. 20, the conductive line structure 450 used to form the functional circuit 400 includes a meander line 780. For example, the meander line 780 includes the first U-shaped conductive line 46U, the second U-shaped conductive line 47U and the third U-shaped conductive line 48U connected in series with the second U-shaped conductive line 47U. As shown in FIG. 20, the length W=100 microns; and the width a2=10 microns. The total length of the meander line 780 is equal to 1 mm, and forms the inductor 440; and the inductor 440 has an inductance value 44G, a specific inductance or a measured inductance. The inductance value 44G is about equal to 0.7 nH.

Figure 21:
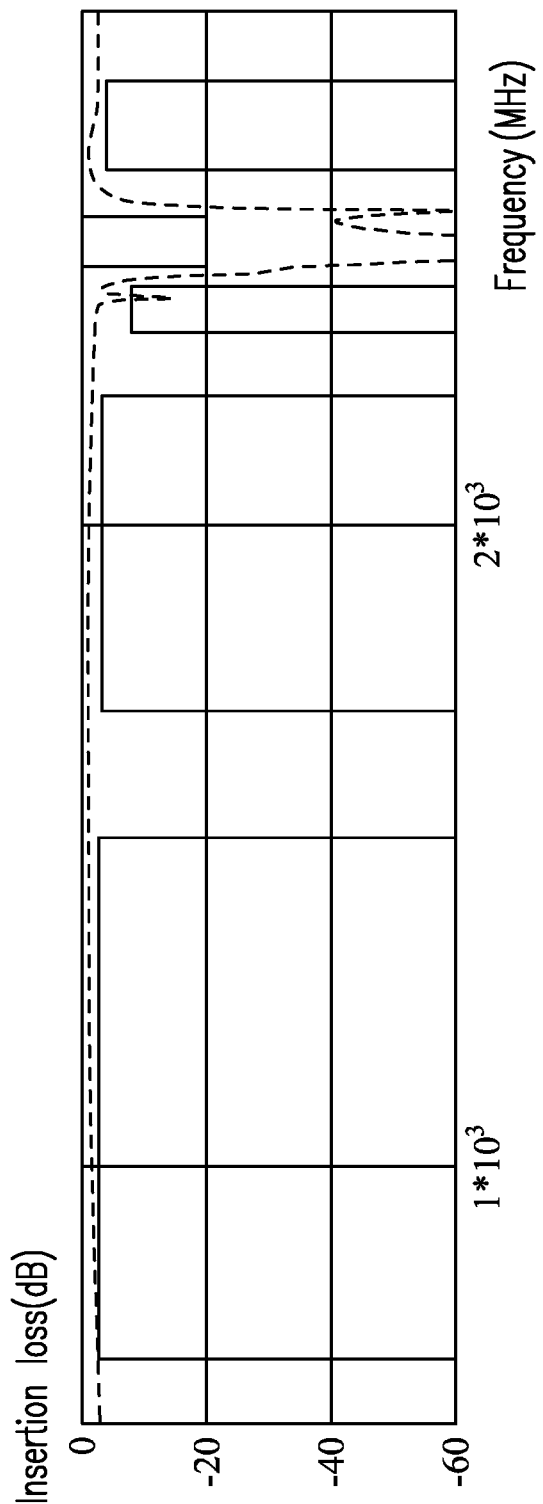
FIG. 21 is a schematic signal power diagram showing a first insertion loss of the diplexer shown in FIG. 14.
Figure 22:
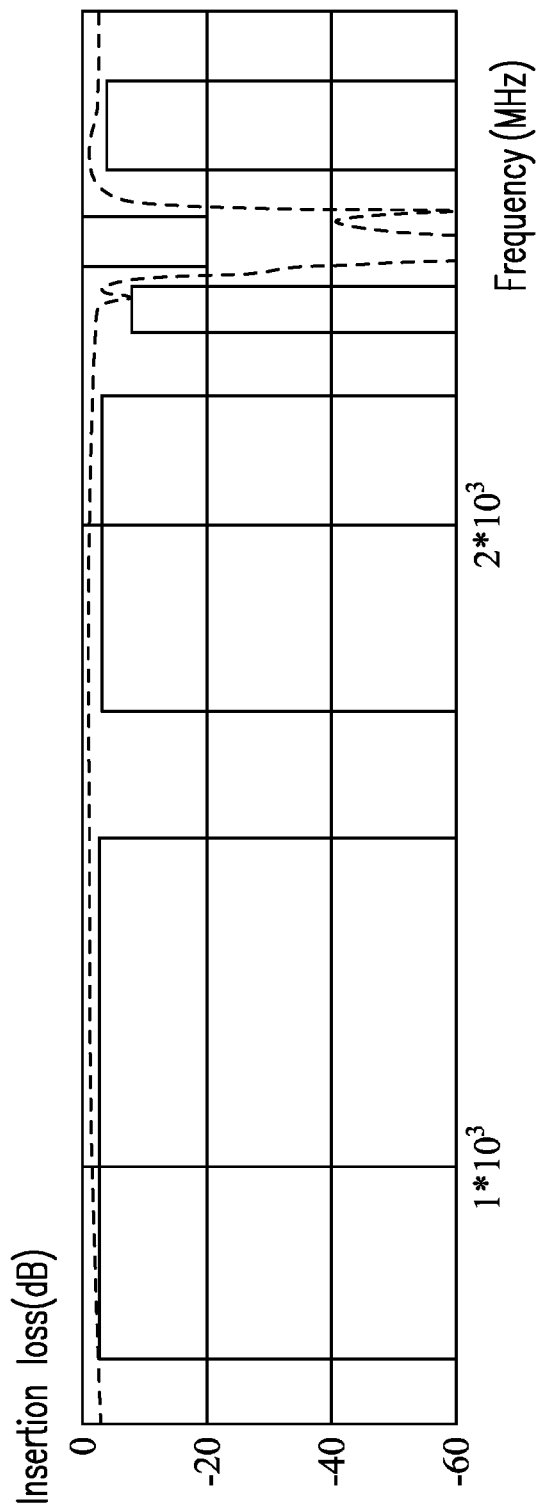
FIG. 22 is a schematic signal power diagram showing a second insertion loss of the diplexer shown in FIG. 14.
Figure 23:
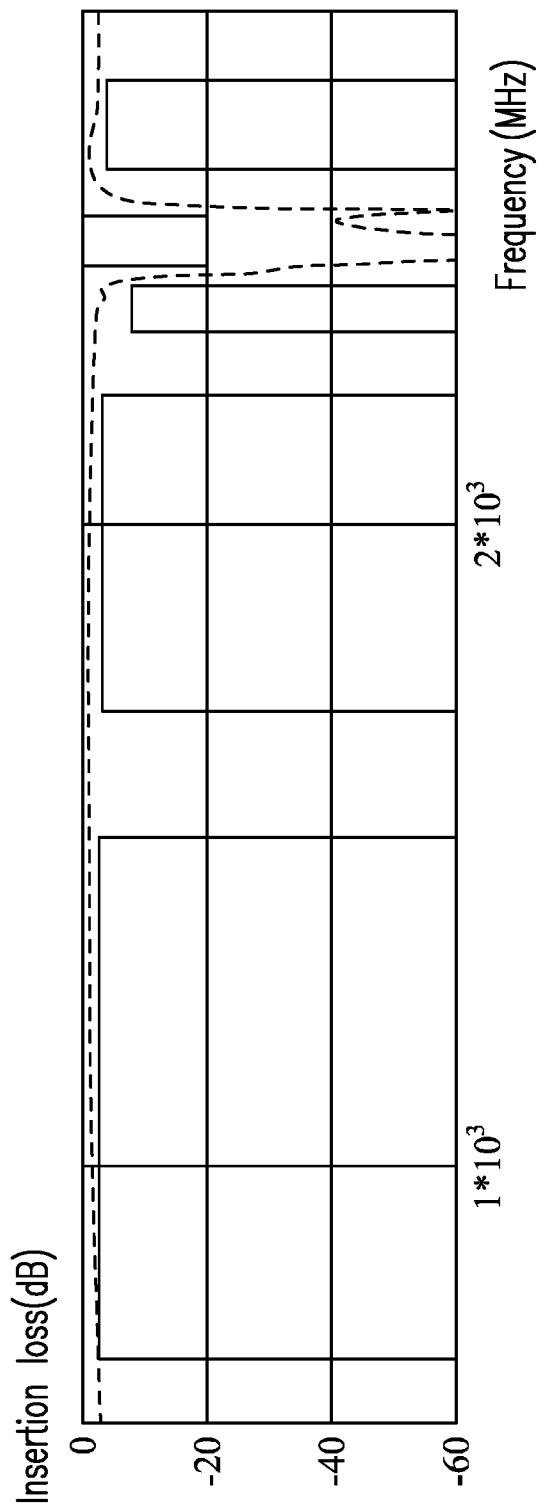
FIG. 23 is a schematic signal power diagram showing a third insertion loss of the diplexer shown in FIG. 14.

Please refer to FIG. 21, FIG. 22 and FIG. 23. FIG. 21 is a schematic signal power diagram showing a first insertion loss of the diplexer 912 shown in FIG. 14. FIG. 22 is a schematic signal power diagram showing a second insertion loss of the diplexer 912 shown in FIG. 14. FIG. 23 is a schematic signal power diagram showing a third insertion loss of the diplexer 912 shown in FIG. 14. Under a condition that the resistance value 42G of the acoustic-wave ladder filter 270 is equal to 0 Ohm, FIG. 21 is shown. Under a condition that the resistance value 42G of the acoustic-wave ladder filter 270 is equal to 5 Ohms, FIG. 22 is shown. Under a condition that the resistance value 42G of the acoustic-wave ladder filter 270 is equal to 15 Ohms, FIG. 23 is shown. For example, the predetermined product specification of the diplexer 912 includes a specific frequency response specification. Under a condition that the resistance value 42G of the acoustic-wave ladder filter 270 is equal to 0 Ohm, the diplexer 912 cannot meet the specific frequency response specification.

In some embodiments, the functional circuit 400 (or the conductive line structure 450) is electrically connected between the interdigital transducer 320 and the grounding terminal 710, and includes the resistor 420. The resistor 420 has a specific resistance or the resistance value 42G. The resistance value 42G ranges from 5 Ohms to 50 Ohms. For example, the resistance value 42G ranges from 10 Ohms to 30 Ohms. In order to cause the diplexer 912 to meet an original specification (or the specific frequency response specification), the resistance value 42G being equal to 5 Ohms serves as a first limit resistance value.

Under a condition that the resistance value 42G is equal to 15 Ohms, the signal power of the acoustic-wave ladder filter 270 at the frequency of 2355 MHz has a depth being less than 2 dB. The resistance value 42G being equal to 15 Ohms causes the passband of the bandpass filter 916 to have a minimal influence. Under a condition that the resistance value 42G is equal to 15 Ohms, the diplexer 912 meets the specific frequency response specification so as to meet the predetermined product specification. Under a condition that the resistance value 42G is equal to 50 Ohms, the passband of the bandpass filter 916 has some degradation. In order to cause the diplexer 912 to meet the original specification (or the specific frequency response specification), the resistance value 42G being equal to 50 Ohms serves as a second limit resistance value.

In some embodiments, the functional circuit 400 further includes the inductor 440 connected in series with the resistor 420. The inductor 440 has the inductance value 44G. The inductor 440 can accomplish the effect of improving the insertion loss and the rejection. For example, the inductance value 44G ranges from 0.25 nH to 2 nH. Under a condition that the inductance value 44G is greater than 2 nH, the rejection of the diplexer 912 has a degradation.

Figure 24A:
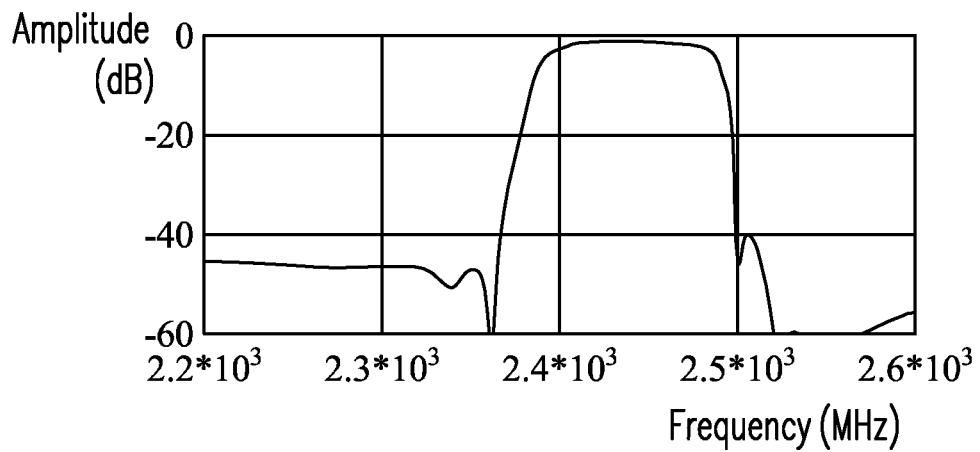
FIG. 24A is a schematic diagram showing a signal power of the acoustic-wave ladder filter shown in FIG. 7.
Figure 24B:
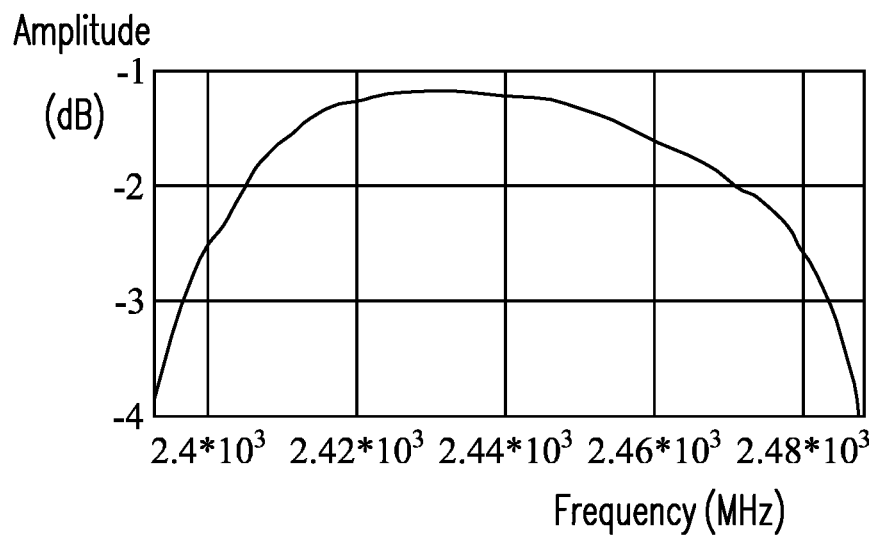
FIG. 24B is a schematic diagram showing a signal power in a specific frequency range of the signal power shown in FIG. 24A.

Please refer to FIG. 24A and FIG. 24B. FIG. 24A is a schematic diagram showing a signal power of the acoustic-wave ladder filter 270 shown in FIG. 7. FIG. 24B is a schematic diagram showing a signal power in a specific frequency range of the signal power shown in FIG. 24A. FIGS. 24A and 24B also show an insertion loss of the acoustic-wave ladder filter 270. As shown in FIGS. 24A and 24B, under a condition that the resistance value 42G is equal to 15 Ohms and the inductance value 44G is equal to 1.0 nH, FIGS. 24A and 24B are shown, and the insertion loss and the rejection of the acoustic-wave ladder filter 270 are improved. As shown in FIGS. 24A and 24B, under a condition that the resistance value 42G is equal to 15 Ohms, the additional insertion loss of the acoustic-wave ladder filter 270 is less than 0.02 dB in comparison to the additional insertion loss of the ladder filter 120.

Figure 25:
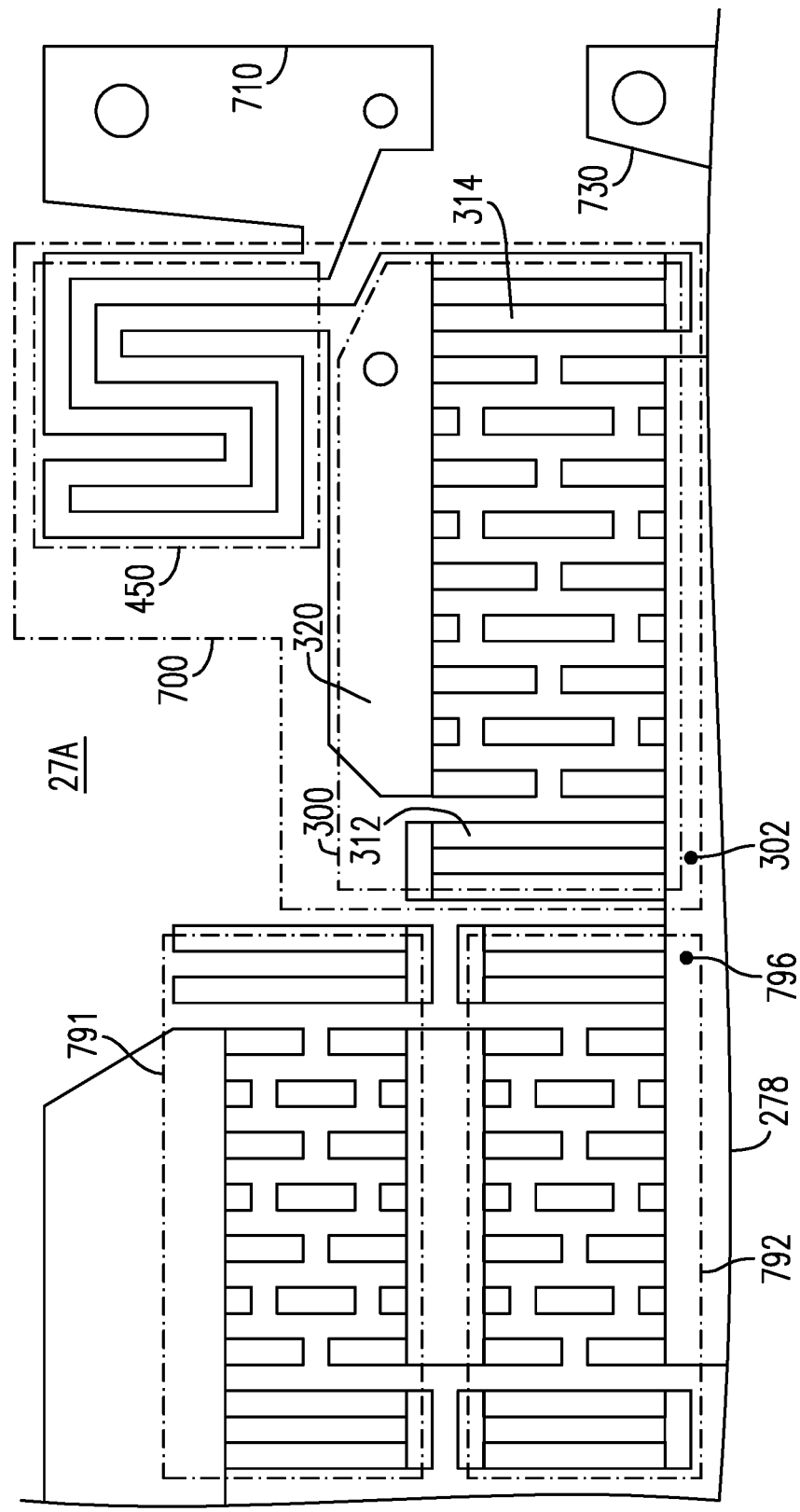
FIG. 25 is a schematic diagram showing an implementation structure of the acoustic-wave ladder filter shown in FIG. 7.

Please refer to FIG. 25, which is a schematic diagram showing an implementation structure 27A of the acoustic-wave ladder filter 270 shown in FIG. 7. As shown in FIG. 25, the acoustic-wave ladder filter 270 further includes a series resonator 791 and a series resonator 792 connected in series with the series resonator 791. The series resonators 791 and 792 are disposed on the piezoelectric substrate 278, and are coupled to and disposed between the first and the second ports 272 and 274 in series. The series resonator 791 has a conductive terminal 796, which is electrically connected to the first conductive terminal 592 of the first series resonator 590 and the second conductive terminal 302 of the first shunt resonator 300. The first shunt resonator 300 includes the first interdigital transducer 320, a reflector 312 and a reflector 314 being opposite to the reflector 312. The acoustic-wave ladder filter 270 includes the first series resonator 590, the series resonator 791, the series resonator 792, the shunt circuit 700 and the grounding terminal 710. For example, the grounding terminal 710 is a common grounding terminal.

Figure 26:
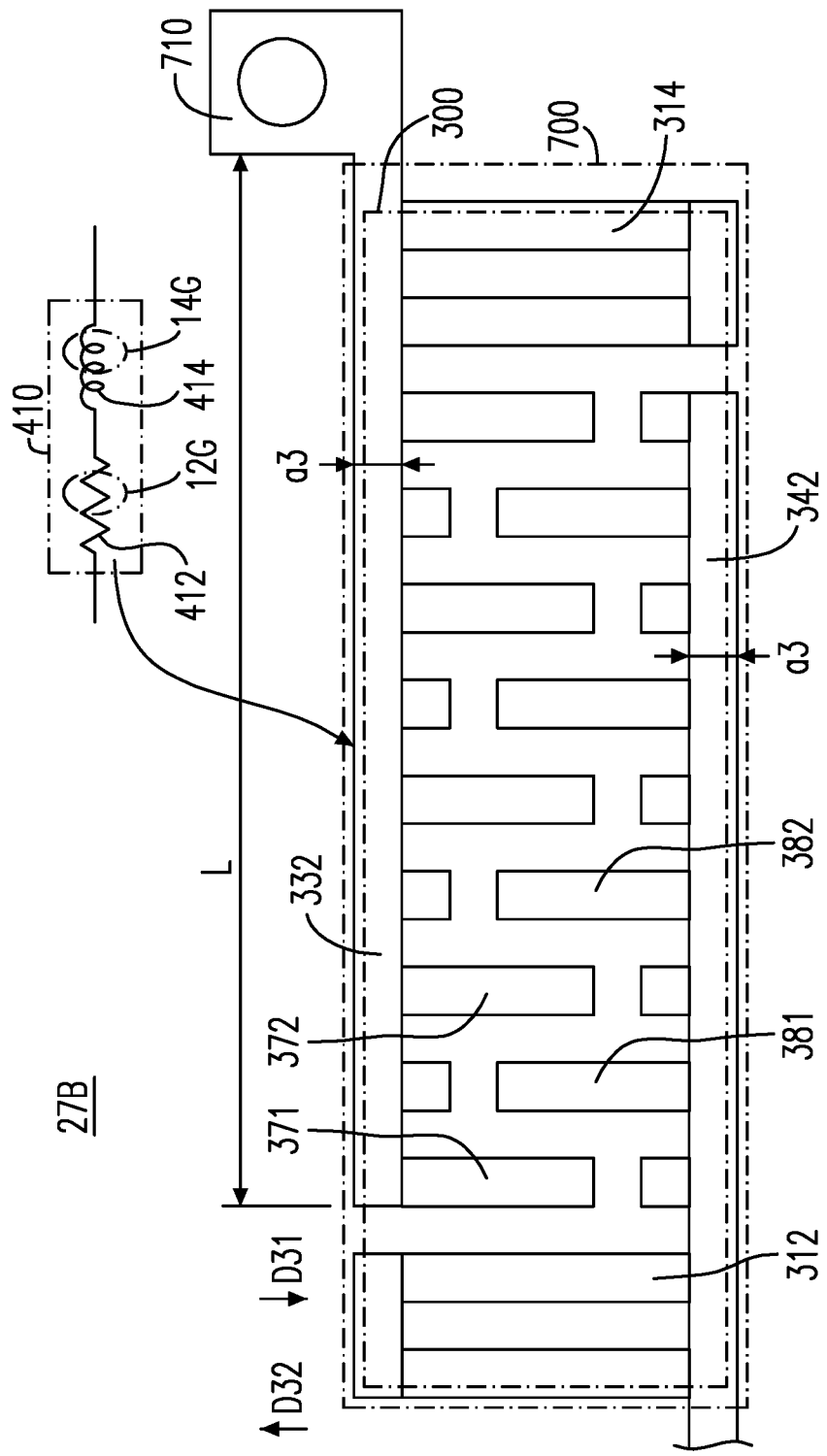
FIG. 26 is a schematic diagram showing an implementation structure of the acoustic-wave ladder filter shown in FIG. 7.

Please refer to FIG. 26, which is a schematic diagram showing an implementation structure 27B of the acoustic-wave ladder filter 270 shown in FIG. 7. As shown in FIG. 26, the acoustic-wave ladder filter 270 includes the shunt circuit 700. The shunt circuit 700 includes the first shunt resonator 300. The first shunt resonator 300 includes a bus bar 332, a bus bar 342 being opposite to the bus bar 332, a reflector 312, a reflector 314 being opposite to the reflector 312, a plurality of metal electrodes 371, 372, . . . extending in a first extension direction D31, and a plurality of metal electrodes 381, 382, . . . extending in a second extension direction D32. The second extension direction D32 is substantially opposite to the first extension direction D31. The bus bar 332 extends to the grounding terminal 710.

Each of the bus bars 332 and 342 has a relatively narrow bus bar width. The bus bars 332 and 342 are used to form a functional circuit 410. The functional circuit 410 includes a resistor 412 and an inductor 414 connected in series with the resistor 412. The resistor 412 has a resistance value 12G. The inductor 414 has an inductance value 14G. The effect of the extra resistance (inductance) can be achieved by the relatively narrow bus bar width. The resistance value 12G can be estimated according to a formula RoL/a3, wherein Ro is the normalized film resistance, and L and a3 are respectively the bus bar length and the bus bar width.

In order to satisfy the resistance value range goal of the resistance value 12G, the bus bar width a3 must range from 2 microns to 20 microns. The resistance value 12G ranges from 5 Ohms to 50 Ohms. The inductance value 14G ranges from 0.2 nH to 0.3 nH. The resistance value 12G and the inductance value 14G can be successfully applied to the single impedance element filter and the diplexer. The advantage of this structure is in the smaller impedance element area, which is of prime importance for compact filters and compact diplexer.

Please refer to FIG. 8. In some embodiments, the implementation structure 90A includes an acoustic-wave ladder filter 270. The acoustic-wave ladder filter 270 has a first port 272, a second port 274 and a grounding terminal 710, and includes a first series resonator 590 and a shunt circuit 700. The first series resonator 590 is coupled to and disposed between the first and the second ports 272 and 274 in series. The shunt circuit 700 is coupled to and disposed between the first series resonator 590 and the grounding terminal 710, and includes a first shunt resonator 300 and a functional circuit 400 connected in series with the first shunt resonator 300. For example, the functional circuit 400 is formed by a conductive line structure 450. For example, the conductive line structure 450 includes a first turn-back conductive line 460 and a second turn-back conductive line 470 connected in series with the first turn-back conductive line 460.

Figure 27:
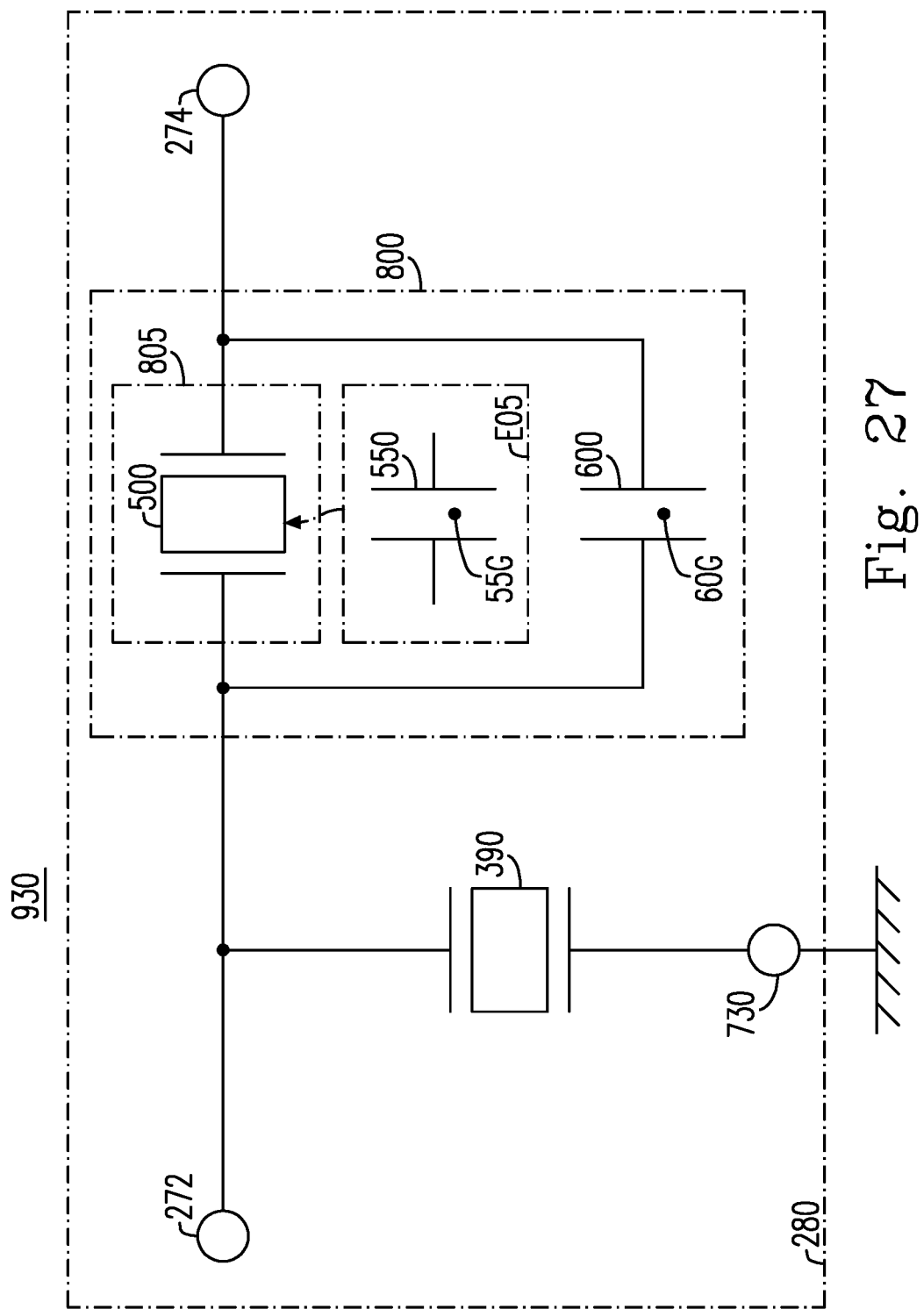
FIG. 27 is a schematic diagram showing a signal processing system according to various embodiments of the present disclosure.

Please refer to FIG. 27, which is a schematic diagram showing a signal processing system 930 according to various embodiments of the present disclosure. As shown in FIG. 27, the signal processing system 930 includes an acoustic-wave ladder filter 280. The acoustic-wave ladder filter 280 has a first port 272, a second port 274 and a grounding terminal 730, and includes a parallel circuit 800 and a first shunt resonator 390. The parallel circuit 800 is coupled to and disposed between the first port 272 and the second port 274 in series, and includes a branch circuit 805 and a functional capacitor 600 connected in parallel with the branch circuit 805.

For example, the branch circuit 805 includes a first series resonator 500. An equivalent circuit E05 of the first series resonator 500 includes a static capacitor 550. The first shunt resonator 390 is coupled to and disposed between the parallel circuit 800 and the grounding terminal 730. For example, the static capacitor 550 has a first capacitance value 55G. The functional capacitor 600 has a second capacitance value 60G. A ratio of the second capacitance value 60G to the first capacitance value 55G ranges from 0.1 to 1.0. For example, the grounding terminal 730 is the grounding terminal 710, or is electrically connected to the grounding terminal 710.

Please additionally refer to FIGS. 11, 12 and 13. For example, the acoustic-wave ladder filter 280 is the acoustic-wave ladder filter 270. In some embodiments, the acoustic-wave ladder filter 280 is used for a diplexer 912, and further includes a piezoelectric substrate 278. Each of the first series resonator 500, the first shunt resonator 390, the grounding terminal 730 and the functional capacitor 600 is disposed on the piezoelectric substrate 278. The functional capacitor 600 is formed by one of a first capacitor structure 6A0 and a second capacitor structure 6B0.

The first capacitor structure 6A0 includes a first metal layer 6A2, a second metal layer 6A4 being opposite to the first metal layer 6A2, and a dielectric layer 6A6 disposed between the first and the second metal layers 6A2 and 6A4. The parallel circuit 800 has a circuit terminal 802 electrically coupled to the first port 272. For example, the first shunt resonator 390 is electrically connected between the circuit terminal 802 and the grounding terminal 730. The first series resonator 500 includes a first interdigital transducer 520. For example, the first interdigital transducer 520 includes a first bus conductor 532 and a first plurality of finger electrodes 571, 572, . . . extending in a first specific direction D51 from the first bus conductor 532. For example, the acoustic-wave ladder filter 280 is a surface-acoustic-wave (SAW) ladder filter. The parallel circuit 800 further has a circuit terminal 804 being opposite to the circuit terminal 802. For example, the circuit terminal 804 is coupled to the second port 274.

The functional capacitor 600 includes a second bus conductor 632 extending from the first bus conductor 532, a second plurality of finger electrodes 671, 672, . . . extending in a second specific direction D61 from the second bus conductor 632, a third bus conductor 642 being opposite to the second bus conductor 632, and a third plurality of finger electrodes 681, 682, . . . extending in a third specific direction D62 being opposite to the second specific direction D61 from the third bus conductor 642. For example, the second specific direction D61 is substantially perpendicular to the first specific direction D51 to reduce a parasitic wave excitation resulting from the functional capacitor 600. The second plurality of finger electrodes 671, 672, . . . and the third plurality of finger electrodes 681, 682, . . . constitute a fourth plurality of finger electrodes 690.

In some embodiments, the first series resonator 500 and the functional capacitor 600 have the same material, and are formed simultaneously. For example, the second capacitor structure 6B0 includes the fourth plurality of finger electrodes 690. The first plurality of finger electrodes 571, 572, . . . are disposed according to a first preset electrode pitch F51. The fourth plurality of finger electrodes 690 are disposed according to a second preset electrode pitch F61. For example, the second preset electrode pitch F61 is less than the first preset electrode pitch F51, or a ratio of the second preset electrode pitch F61 to the first preset electrode pitch F51 is less than 0.7.

The fourth plurality of finger electrodes 690 are arranged to form one of a equal-distance electrode distribution and a non-equal-distance electrode distribution, and includes a first finger electrode 671 and a second finger electrode 672 adjacent to the first finger electrode 671. For example, the first and the second finger electrodes 671 and 672 have the same voltage polarity. For example, the second preset electrode pitch F61 is less than the first preset electrode pitch F51 to reduce a parasitic wave excitation resulting from the functional capacitor 600. The functional capacitor 600 is deposited on one of the piezoelectric substrate 278 and an acoustic-wave die by using a metal.

Please additionally refer to FIGS. 8, 9 and 10. In some embodiments, the acoustic-wave ladder filter 280 further includes a second series resonator 590 and a shunt circuit 700. The second series resonator 590 is coupled to and disposed between the first port 272 and the circuit terminal 802 in series, and has a first conductive terminal 592 being opposite to the circuit terminal 802. The shunt circuit 700 is coupled to and disposed between the first conductive terminal 592 and the grounding terminal 730, and includes a second shunt resonator 300 and a functional circuit 400 connected in series with the second shunt resonator 300. For example, the functional circuit 400 includes a resistor 420 having a resistance value 42G. The resistance value 42G ranges from 5 Ohms to 50 Ohms.

The second shunt resonator 300 has a second conductive terminal 302 electrically connected to the first conductive terminal 592, and a third conductive terminal 304 being opposite to the second conductive terminal 302, and includes a first interdigital transducer 320. For example, the functional circuit 400 is electrically connected between the third conductive terminal 304 and the grounding terminal 730. The functional circuit 400 is formed by a conductive line structure 450. For example, the conductive line structure 450 has a first physical structure 452 physically forming the resistor 420, and is one selected from a group consisting of a bifilar coil, an incorporated meander coil and a strip line coil.

In some embodiments, the conductive line structure 450 includes a first turn-back conductive line 460 and a second turn-back conductive line 470 connected in series with the first turn-back conductive line 460. For example, the first turn-back conductive line 460 is one of a first U-shaped conductive line 46U and a first half-turn conductive line 46P. The second turn-back conductive line 470 is one of a second U-shaped conductive line 47U and a second half-turn conductive line 47P. The second shunt resonator 300, the grounding terminal 730 and the functional circuit 400 have the same material, and are formed simultaneously.

The second interdigital transducer 320 includes a bus bar 332, and a plurality of metal electrodes 371, 372, . . . extending in a first extension direction D31 from the bus bar 332, and has the third conductive terminal 304 directly electrically connected with the conductive line structure 450. The conductive line structure 450 includes a conductive line segment 456 extending in a second extension direction D41 from the third conductive terminal 304. For example, the second extension direction D41 is substantially parallel with the first extension direction D31.

The functional circuit 400 further includes an inductor 440 connected in series with the resistor 420. For example, the inductor 440 has an inductance value 44G. The inductance value 44G is less than 2 nano Henries (nH). The conductive line structure 450 further has a second physical structure 454 physically forming the inductor 440, and includes a relatively narrow conductive line 490 having a width 49W. For example, the width 49W ranges from 2 µm to 20 µm.

Figure 28:
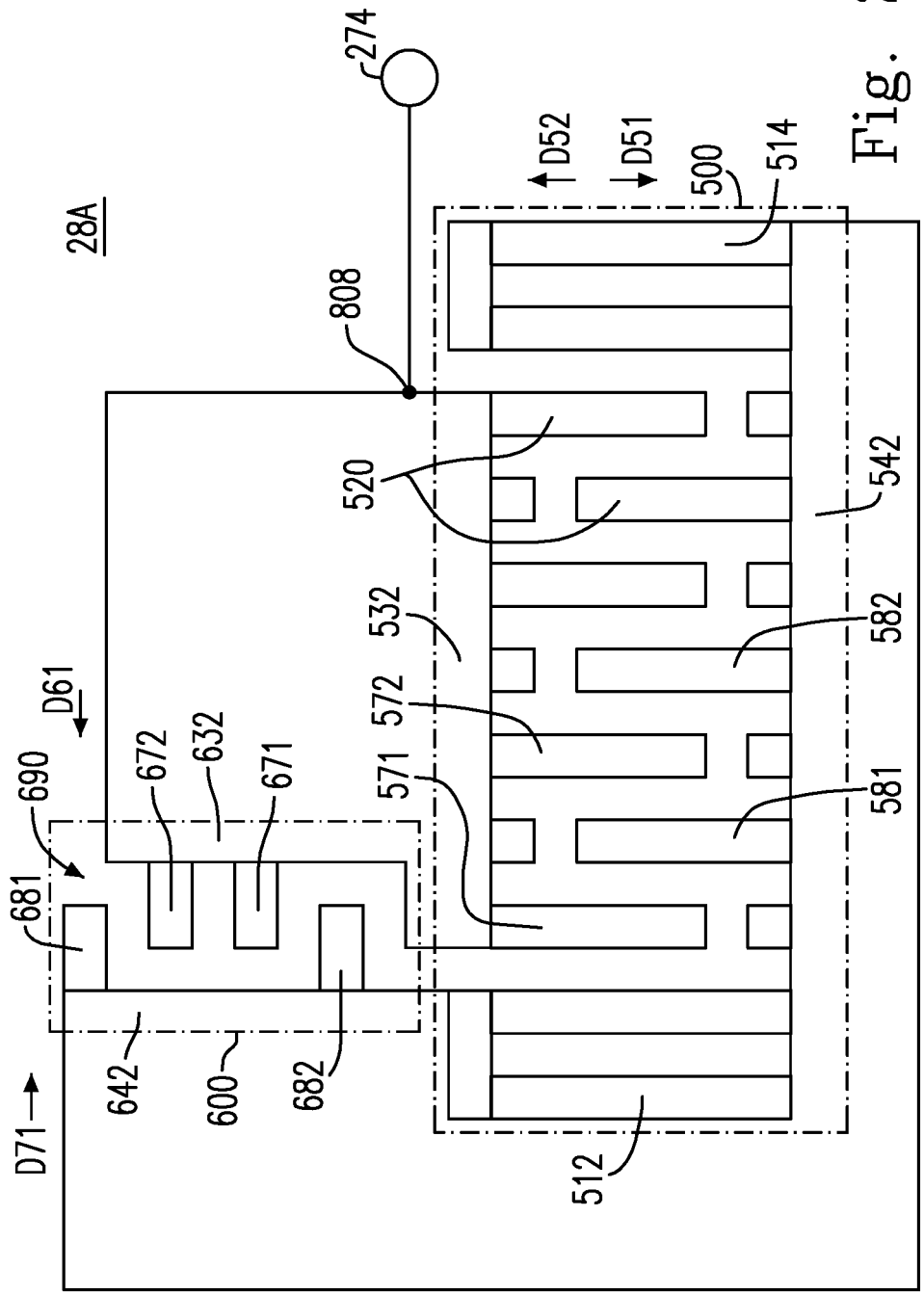
FIG. 28 is a schematic diagram showing an implementation structure of the acoustic-wave ladder filter shown in FIG. 27.

Please refer to FIG. 28, which is a schematic diagram showing an implementation structure 28A of the acoustic-wave ladder filter 280 shown in FIG. 27. As shown in FIG. 28, the implementation structure 28A includes the first series resonator 500 and the functional capacitor 600 connected in parallel with the first series resonator 500. The first series resonator 500 includes the first interdigital transducer 520, a reflector 512, and a reflector 514 being opposite to the reflector 512. The first interdigital transducer 520 includes the first bus conductor 532, a bus conductor 542 being opposite to the first bus conductor 532, the first plurality of finger electrodes 571, 572, . . . extending in the first specific direction D51 from the first bus conductor 532, and a plurality of finger electrodes 581, 582, . . . extending in a specific direction D52 from the bus conductor 542. The specific direction D52 is substantially opposite to the first specific direction D51.

In some embodiments, the acoustic-wave ladder filter 280 serves as a bandpass filter; and the close rejection of the acoustic-wave ladder filter 280 at the frequency of 2.5 GHz depends on the first series resonator 500. In order to minimize the transition band of the acoustic-wave ladder filter 280, the functional capacitor 600 is formed, and is connected in parallel with the second interdigital transducer 520. The static capacitor 550 of the second interdigital transducer 520 has the first capacitance value 55G or a measured capacitance. The functional capacitor 600 has the second capacitance value 60G or a measured capacitance. For example, a ratio of the second capacitance value 60G to the first capacitance value 55G ranges from 0.1 to 1.0.

Under a condition that a ratio of the second capacitance value 60G to the first capacitance value 55G is less than 0.1, the functional capacitor 600 has small influence on the transition band. Under a condition that a ratio of the second capacitance value 60G to the first capacitance value 55G is greater than 1.0, there is some degradation in the frequency band of the acoustic-wave ladder filter 280 (serving as a bandpass filter). For example, a ratio of the second capacitance value 60G to the first capacitance value 55G ranges from 0.3 to 0.7.

Please refer to FIGS. 13 and 27. In some embodiments, the signal processing system 930 includes an acoustic-wave ladder filter 280. The acoustic-wave ladder filter 280 has a first port 272, a second port 274 and a grounding terminal 730, and includes a parallel circuit 800 and a first shunt resonator 390. The parallel circuit 800 is coupled to and disposed between the first port 272 and the second port 274 in series, and includes a branch circuit 805 and a functional capacitor 600 connected in parallel with the branch circuit 805. The first shunt resonator 390 is coupled to and disposed between the parallel circuit 800 and the grounding terminal 730.

For example, the branch circuit 805 includes a first series resonator 500. The first series resonator 500 includes a first bus conductor 532 and a first plurality of finger electrodes 571, 572, . . . extending in a first specific direction D51 from the first bus conductor 532. The functional capacitor 600 includes a second bus conductor 632 extending from the first bus conductor 532, and a second plurality of finger electrodes 671, 672, . . . extending in a second specific direction D61 from the second bus conductor 632. The second specific direction D61 is substantially perpendicular to the first specific direction D51.

Figure 29:
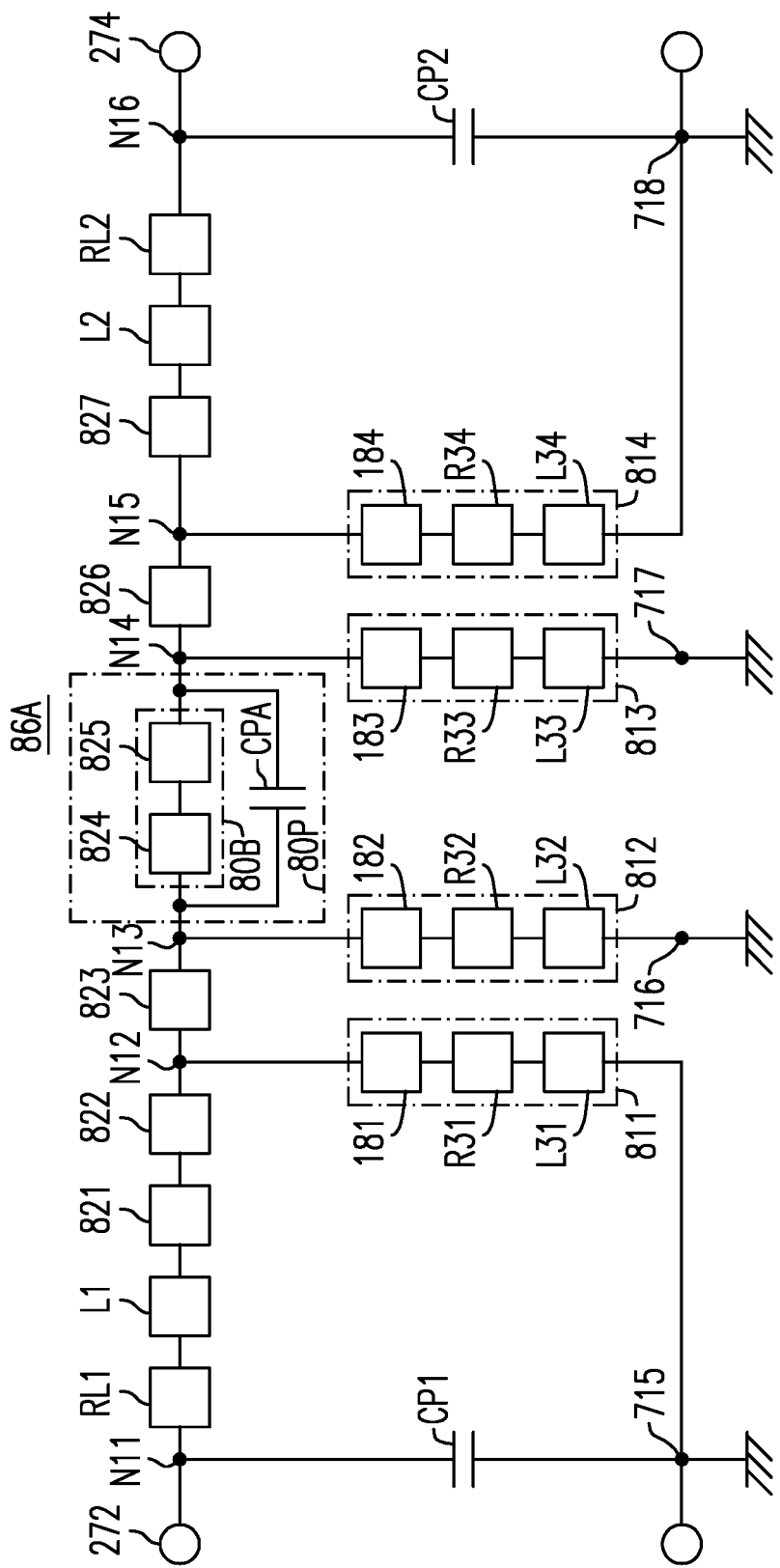
FIG. 29 is a schematic diagram showing an implementation structure of the bandpass filter shown in FIG. 14.

Please refer to FIG. 29, which is a schematic diagram showing an implementation structure 86A of the bandpass filter 916 shown in FIG. 14. As shown in FIG. 29, the implementation structure 86A of the bandpass filter 916 has a first port 272, a second port 274, a plurality of grounding terminals 715, 716, 717 and 718, a plurality of nodes N11, N12, N13, N14, N15 and N16, and includes a plurality of series resonators 821, 822, 823, 824, 825, 826 and 827, a plurality of shunt resonators 811, 812, 813 and 814, a series resistor RL1, a series resistor RL2, a series inductor L1, a series inductor L2, a shunt capacitor CP1, a shunt capacitor CP2, and a functional capacitor CPA. The series resistor RL1, the series inductor L1, the plurality of series resonators 821, 822, 823, 824, 825, 826 and 827, the series inductor L2, and the series resistor RL2 are coupled to and disposed between the first and the second ports 272 and 274 in series.

In some embodiments, the implementation structure 96A includes a parallel circuit 80P electrically connected between the nodes N13 and N14. The parallel circuit 80P includes a branch circuit 80B and the functional capacitor CPA connected in parallel with the branch circuit 80B. The branch circuit 80B includes the series resonator 823 and the series resonator 824 connected in series with the series resonator 823. The parallel circuit 80P, the branch circuit 80B and the functional capacitor CPA are the parallel circuit 800, the branch circuit 805 and the functional capacitor 600, respectively. The second series resonator 500 is one selected from a group consisting of the series resonator 823, the series resonator 824 and a series combination of the series resonators 823 and 824. The series resonators 821 and 822 are the series resonators 791 and 792, respectively.

The shunt capacitor CP1 is electrically connected between the node N11 and the grounding terminal 715. The shunt resonator 811 is electrically connected between the node N12 and the grounding terminal 715. The shunt resonator 812 is electrically connected between the node N13 and the grounding terminal 716. The shunt resonator 813 is electrically connected between the node N14 and the grounding terminal 717. The shunt resonator 814 is electrically connected between the node N15 and the grounding terminal 718. The shunt capacitor CP2 is electrically connected between the node N16 and the grounding terminal 718. For example, the series resonators 821 and 822 have the same functional structure. The series resonators 823 and 826 have the same functional structure. The series resonators 824 and 825 have the same functional structure. The shunt resonators 812 and 813 have the same functional structure. The grounding terminal 715 is the grounding terminal 710.

In some embodiments, the shunt resonator 811 includes a resonator portion 181, a resistor R31 and an inductor L31. The resonator portion 181, the resistor R31 and the inductor L31 are electrically connected between the node N12 and the grounding terminal 715 in series. An interdigital transducer of the shunt resonator 811 includes a bus bar and a plurality of metal electrodes extending from the bus bar; and the bus bar and the plurality of metal electrodes form the resistor R31 and the inductor L31. The shunt resonator 812 includes a resonator portion 182, a resistor R32 and an inductor L32. The resonator portion 182, the resistor R32 and the inductor L32 are electrically connected between the node N13 and the grounding terminal 716 in series. An interdigital transducer of the shunt resonator 812 forms the resistor R32 and the inductor L32. For example, the shunt resonator 811 is the first shunt resonator 300. The shunt resonator 812 is the second shunt resonator 390.

The shunt resonator 813 includes a resonator portion 183, a resistor R33 and an inductor L33. The resonator portion 183, the resistor R33 and the inductor L33 are electrically connected between the node N14 and the grounding terminal 717 in series. An interdigital transducer of the shunt resonator 813 forms the resistor R33 and the inductor L33. The shunt resonator 814 includes a resonator portion 184, a resistor R34 and an inductor L34. The resonator portion 184, the resistor R34 and the inductor L34 are electrically connected between the node N15 and the grounding terminal 718 in series. An interdigital transducer of the shunt resonator 814 forms the resistor R34 and the inductor L34.

Figure 30:
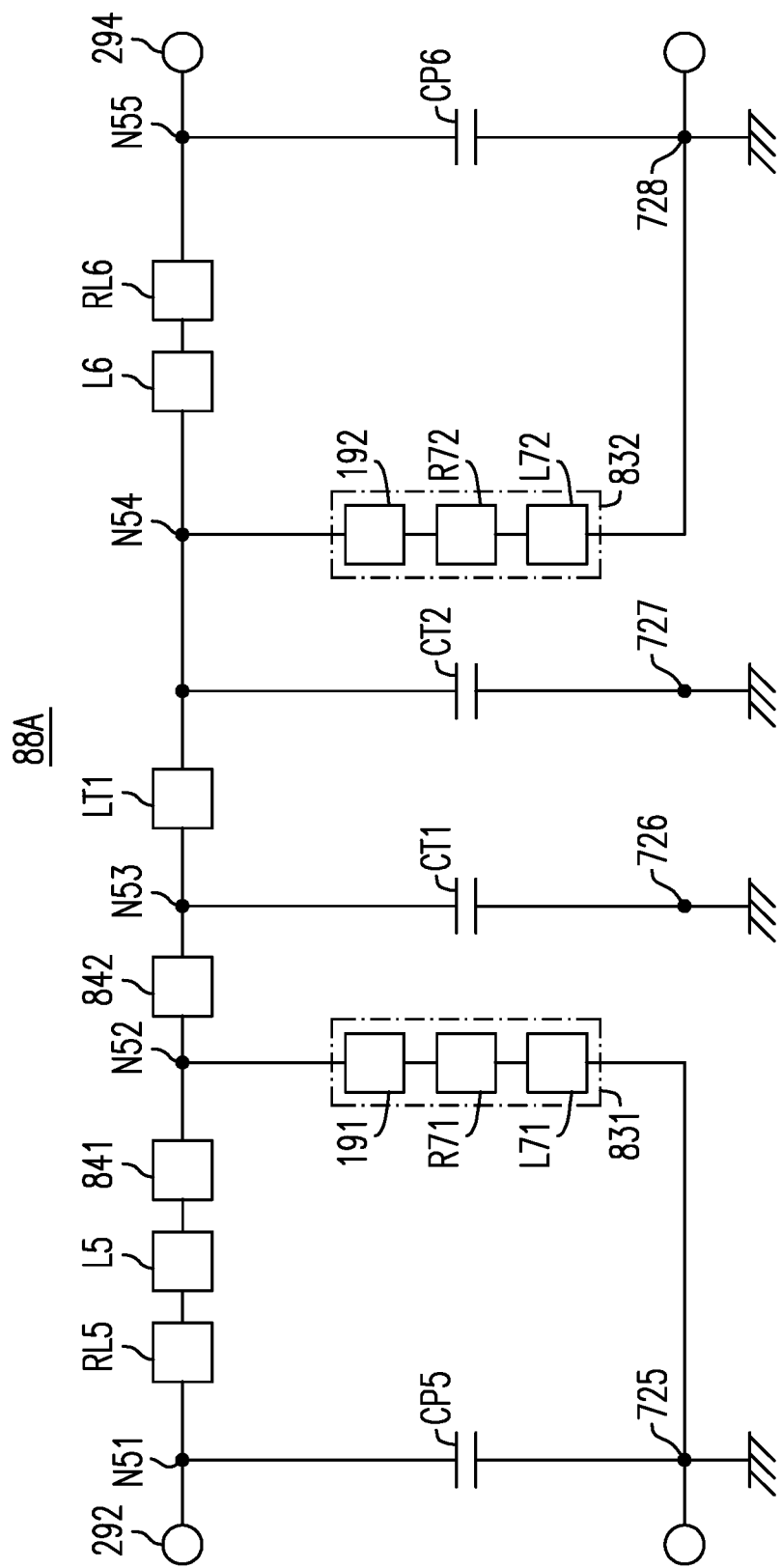
FIG. 30 is a schematic diagram showing an implementation structure of the notch filter shown in FIG. 14.

Please refer to FIG. 30, which is a schematic diagram showing an implementation structure 88A of the notch filter 918 shown in FIG. 14. As shown in FIG. 30, the implementation structure 88A of the notch filter 918 has a first port 292, a second port 294, a plurality of grounding terminals 725, 726, 727 and 728, a plurality of nodes N51, N52, N53, N54 and N55, and includes a plurality of series resonators 841 and 842, a plurality of shunt resonators 831 and 832, a series resistor RL5, a series resistor RL6, a plurality of series inductors L5, LT1 and L6, and a plurality of shunt capacitors CP5, CT1, CT2 and CP6. The series resistor RL5, the series inductor L5, the plurality of series resonators 841 and 842, the series inductor LT1, the series inductor L6, and the series resistor R62 are coupled to and disposed between the first and the second ports 292 and 294 in series.

In some embodiments, the shunt capacitor CP5 is electrically connected between the node N51 and the grounding terminal 725. The shunt resonator 831 is electrically connected between the node N52 and the grounding terminal 725. The shunt capacitor CT1 is electrically connected between the node N53 and the grounding terminal 726. The shunt capacitor CT2 is electrically connected between the node N54 and the grounding terminal 727. The shunt resonator 832 is electrically connected between the node N54 and the grounding terminal 728. The shunt capacitor CP6 is electrically connected between the node N55 and the grounding terminal 728.

For example, the series resonators 841 and 823 have the same functional structure. The series resonators 842 and 824 have the same functional structure. The shunt resonators 831 and 811 have the same functional structure. The shunt resonators 832 and 813 have the same functional structure.

The shunt resonator 831 includes a resonator portion 191, a resistor R71 and an inductor L71. The resonator portion 191, the resistor R71 and the inductor L71 are electrically connected between the node N52 and the grounding terminal 725 in series. An interdigital transducer of the shunt resonator 831 includes a bus bar and a plurality of metal electrodes extending from the bus bar; and the bus bar and the plurality of metal electrodes form the resistor R71 and the inductor L71. The shunt resonator 832 includes a resonator portion 192, a resistor R72 and an inductor L72. The resonator portion 192, the resistor R72 and the inductor L72 are electrically connected between the node N54 and the grounding terminal 728 in series. An interdigital transducer of the shunt resonator 832 forms the resistor R72 and the inductor L72.

Figure 31:
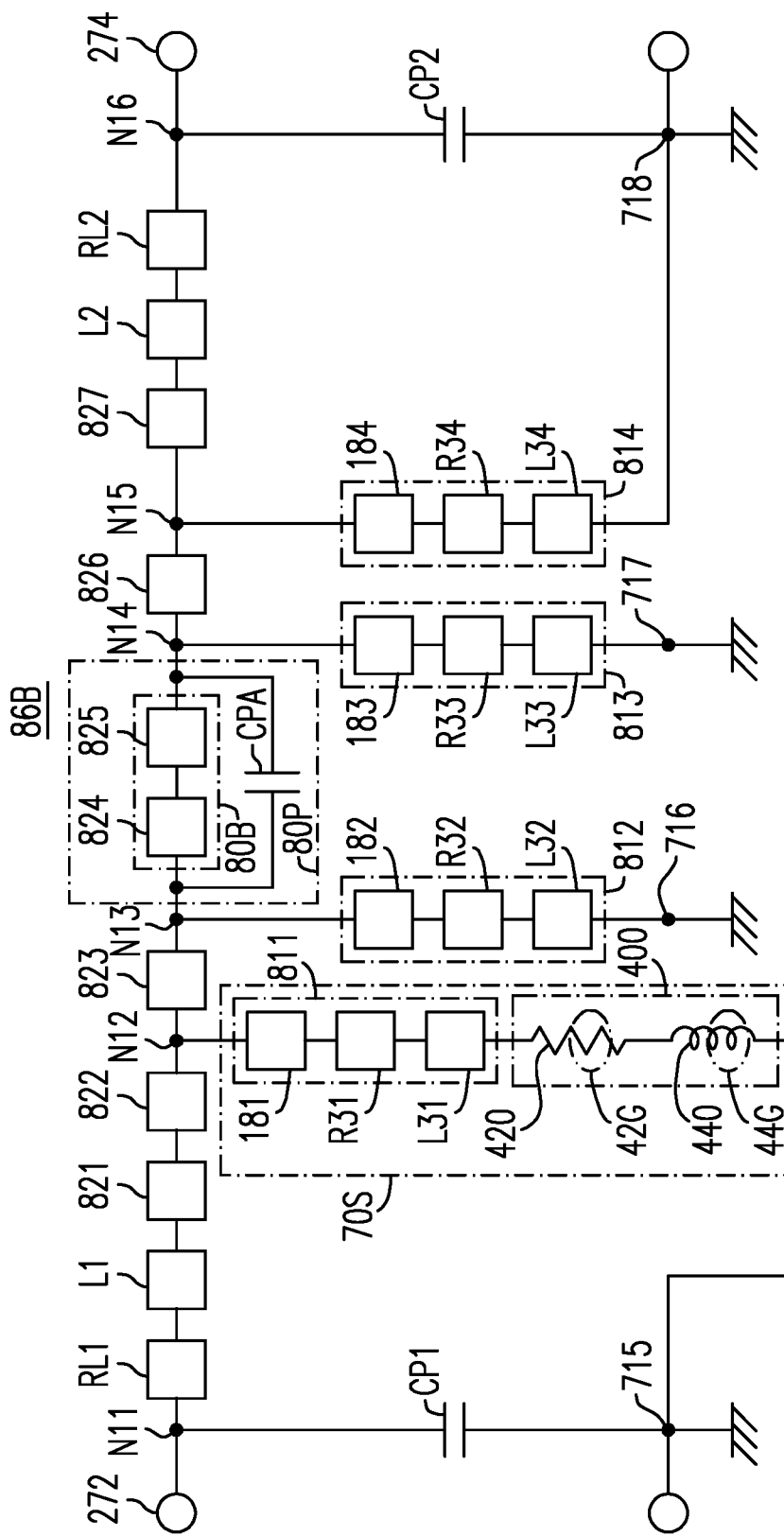
FIG. 31 is a schematic diagram showing an implementation structure of the bandpass filter shown in FIG. 14.

Please refer to FIG. 31, which is a schematic diagram showing an implementation structure 86B of the bandpass filter 916 shown in FIG. 14. As shown in FIG. 31, the implementation structure 86B is similar to the implementation structure 86A shown in FIG. 29. The difference between the implementation structures 86A and 86B is described as follows. The implementation structure 86B of the bandpass filter 916 further includes a functional circuit 400. The functional circuit 400 is electrically connected between the shunt resonator 811 and the grounding terminal 715. The functional circuit 400 is connected in series with the shunt resonator 811, and includes a resistor 420 and an inductor 440 connected in series with the resistor 420. The resistor 420 has a resistance value 42G. The resistance value 42G ranges from 5 Ohms to 50 Ohms. The inductor 440 has an inductance value 44G. The inductance value 44G is less than 2 nH.

For example, the implementation structure 86B includes a shunt circuit 70S coupled to and disposed between the node N12 and the grounding terminal 715. The shunt circuit 70S includes the shunt resonator 811 and the functional circuit 400 connected in series with the shunt resonator 811. For example, the shunt circuit 70S is the shunt circuit 700. The implementation structure 86B is coupled to the implementation structure 88A. The implementation structure 86B and the implementation structure 88A have an electrical interaction therebetween. At least one of the functional capacitor CPA and the functional circuit 400 is used to cause the diplexer 912 to meet a predetermined product specification of the diplexer 912.

While the invention has been described in terms of what is presently considered to be the most practical and preferred embodiments, it is to be understood that the disclosure need not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:
1. An acoustic-wave ladder filter having a first port, a second port and a grounding terminal, and comprising:
   a first series resonator coupled to and disposed between the first and the second ports in series; and
   a shunt circuit coupled to and disposed between the first series resonator and the grounding terminal, and including:
   a first shunt resonator;
   a functional circuit connected in series with the first shunt resonator, wherein the functional circuit includes a resistor having a resistance value being greater than 5 Ohms; and
   a piezoelectric substrate, wherein:
   the resistance value ranges from 5 Ohms to 50 Ohms;
   each of the first series resonator, the shunt circuit and the grounding terminal is disposed on the piezoelectric substrate;
   the first series resonator has a first conductive terminal coupled to the first port;
   the first shunt resonator has a second conductive terminal electrically connected to the first conductive terminal and a third conductive terminal being opposite to the second conductive terminal, and includes a first interdigital transducer;
   the functional circuit is electrically connected between the third conductive terminal and the grounding terminal; and
   the acoustic-wave ladder filter is used for a diplexer.

2. The acoustic-wave ladder filter according to claim 1, wherein:
the functional circuit is formed by a conductive line structure, wherein the conductive line structure has a first physical structure physically forming the resistor, and is one selected from a group consisting of a bifilar coil, an incorporated meander coil and a strip line coil;
the conductive line structure includes a first turn-back conductive line and a second turn-back conductive line connected in series with the first turn-back conductive line, wherein the first turn-back conductive line is one of a first U-shaped conductive line and a first half-turn conductive line, and the second turn-back conductive line is one of a second U-shaped conductive line and a second half-turn conductive line; and
the first shunt resonator, the grounding terminal and the functional circuit include the same material, and are formed simultaneously.

3. The acoustic-wave ladder filter according to claim 2, wherein:
the first interdigital transducer includes a bus bar, a plurality of metal electrodes extending in a first extension direction from the bus bar and the third conductive terminal directly electrically connected with the conductive line structure;
the conductive line structure includes a conductive line segment extending in a second extension direction from the third conductive terminal, wherein the second extension direction is substantially parallel with the first extension direction;
the functional circuit further includes an inductor connected in series with the resistor, wherein the inductor has an inductance value being less than 2 nano Henries (nH); and
the conductive line structure further includes a second physical structure physically forming the inductor and a relatively narrow conductive line having a width ranging from 2 μm to 20 μm.

4. The acoustic-wave ladder filter according to claim 1, wherein:
the first series resonator further includes a fourth conductive terminal being opposite to the first conductive terminal, wherein the fourth conductive terminal is coupled to the second port;
the acoustic-wave ladder filter further includes a parallel circuit and a second shunt resonator coupled to and disposed between the fourth conductive terminal and the grounding terminal;
the parallel circuit is coupled to and disposed between the fourth conductive terminal and the second port in series, and includes a functional capacitor and a branch circuit connected in parallel with the functional capacitor; and
the branch circuit includes a second series resonator, and an equivalent circuit of the second series resonator includes a static capacitor, wherein the static capacitor has a first capacitance value, the functional capacitor has a second capacitance value, and a ratio of the second capacitance value to the first capacitance value ranges from 0.1 to 1.0.

5. The acoustic-wave ladder filter according to claim 4, wherein:
the functional capacitor is formed by one of a first capacitor structure and a second capacitor structure;
the first capacitor structure includes a first metal layer, a second metal layer being opposite to the first metal layer and a dielectric layer disposed between the first and the second metal layers;
the second series resonator includes a second interdigital transducer having a first bus conductor and a first plurality of finger electrodes extending in a first specific direction from the first bus conductor; and
the functional capacitor includes a second bus conductor extending from the first bus conductor, a second plurality of finger electrodes extending in a second specific direction from the second bus conductor, a third bus conductor being opposite to the second bus conductor and a third plurality of finger electrodes extending in a third specific direction being opposite to the second specific direction from the third bus conductor, wherein the second specific direction is substantially perpendicular to the first specific direction, and the second plurality of finger electrodes and the third plurality of finger electrodes constitute a fourth plurality of finger electrodes.

6. The acoustic-wave ladder filter according to claim 5, wherein:
the second series resonator and the functional capacitor include the same material, and are formed simultaneously, wherein the second capacitor structure includes the fourth plurality of finger electrodes;
the first plurality of finger electrodes are disposed according to a first preset electrode pitch;
the fourth plurality of finger electrodes are disposed according to a second preset electrode pitch being less than the first preset electrode pitch; and
the fourth plurality of finger electrodes are arranged to form an equal-distance electrode distribution, and includes a first finger electrode and a second finger electrode adjacent to the first finger electrode, wherein the first and the second finger electrodes have the same voltage polarity.

7. An acoustic-wave ladder filter having a first port, a second port and a grounding terminal, and comprising:
a first series resonator coupled to and disposed between the first and the second ports in series;
a shunt circuit coupled to and disposed between the first series resonator and the grounding terminal, and including a first shunt resonator and a functional circuit connected in series with the first shunt resonator, wherein the functional circuit is formed by a conductive line structure having a first turn-back conductive line and a second turn-back conductive line connected in series with the first turn-back conductive line; and
a piezoelectric substrate, wherein:
the first turn-back conductive line is one of a first U-shaped conductive line and a first half-turn conductive line;
the second turn-back conductive line is one of a second U-shaped conductive line and a second half-turn conductive line;
each of the first series resonator, the shunt circuit and the grounding terminal is disposed on the piezoelectric substrate;
the functional circuit includes a resistor having a resistance value, wherein the resistance value ranges from 5 Ohms to 50 Ohms;
the first series resonator has a first conductive terminal coupled to the first port;
the first shunt resonator has a second conductive terminal electrically connected to the first conductive terminal, and a third conductive terminal being opposite to the second conductive terminal, and includes a first interdigital transducer;

the functional circuit is electrically connected between the third conductive terminal and the grounding terminal; and the acoustic-wave ladder filter is used for a diplexer.

8. The acoustic-wave ladder filter according to claim 7, wherein:

the conductive line structure has a first physical structure physically forming the resistor, and is one selected from a group consisting of a bifilar coil, an incorporated meander coil and a strip line coil;

the first shunt resonator, the grounding terminal and the functional circuit include the same material, and are formed simultaneously; and the first interdigital transducer includes a bus bar, a plurality of metal electrodes extending in a first extension direction from the bus bar and the third conductive terminal directly electrically connected with the conductive line structure.

9. The acoustic-wave ladder filter according to claim 8, wherein:

the conductive line structure includes a conductive line segment extending in a second extension direction from the third conductive terminal, wherein the second extension direction is substantially parallel with the first extension direction;

the functional circuit further includes an inductor connected in series with the resistor, wherein the inductor has an inductance value being less than 2 nano Henries (nH); and the conductive line structure further includes a second physical structure physically forming the inductor and a relatively narrow conductive line having a width ranging from 2 μm to 20 μm.

10. The acoustic-wave ladder filter according to claim 7, wherein:

the first series resonator further includes a fourth conductive terminal being opposite to the first conductive terminal, wherein the fourth conductive terminal is coupled to the second port;

the acoustic-wave ladder filter further includes a parallel circuit and a second shunt resonator coupled to and disposed between the fourth conductive terminal and the grounding terminal;

the parallel circuit is coupled to and disposed between the fourth conductive terminal and the second port in series, and includes a functional capacitor and a branch circuit connected in parallel with the functional capacitor;

the branch circuit includes a second series resonator; and an equivalent circuit of the second series resonator includes a static capacitor, wherein the static capacitor has a first capacitance value, the functional capacitor has a second capacitance value, and a ratio of the second capacitance value to the first capacitance value ranges from 0.1 to 1.0.

11. The acoustic-wave ladder filter according to claim 10, wherein:

the functional capacitor is formed by one of a first capacitor structure and a second capacitor structure;

the first capacitor structure includes a first metal layer, a second metal layer being opposite to the first metal layer, and a dielectric layer disposed between the first and the second metal layers;

the second series resonator includes a second interdigital transducer having a first bus conductor and a first plurality of finger electrodes extending in a first specific direction from the first bus conductor; and the functional capacitor includes a second bus conductor extending from the first bus conductor, a second plurality of finger electrodes extending in a second specific direction from the second bus conductor, a third bus conductor being opposite to the second bus conductor, and a third plurality of finger electrodes extending in a third specific direction being opposite to the second specific direction from the third bus conductor, wherein the second specific direction is substantially perpendicular to the first specific direction, and the second plurality of finger electrodes and the third plurality of finger electrodes constitute a fourth plurality of finger electrodes.

12. The acoustic-wave ladder filter according to claim 11, wherein:

the second series resonator and the functional capacitor include the same material, and are formed simultaneously, wherein the second capacitor structure includes the fourth plurality of finger electrodes;

the first plurality of finger electrodes are disposed according to a first preset electrode pitch;

the fourth plurality of finger electrodes are disposed according to a second preset electrode pitch being less than the first preset electrode pitch; and the fourth plurality of finger electrodes are arranged to form an equal-distance electrode distribution, and includes a first finger electrode and a second finger electrode adjacent to the first finger electrode, wherein the first and the second finger electrodes have the same voltage polarity.

13. An acoustic-wave ladder filter having a first port, a second port and a grounding terminal, and comprising:

a parallel circuit coupled to and disposed between the first port and the second port in series, and including a branch circuit and a functional capacitor connected in parallel with the branch circuit, wherein the branch circuit includes a first series resonator, and an equivalent circuit of the first series resonator includes a static capacitor; and a first shunt resonator coupled to and disposed between the parallel circuit and the grounding terminal, wherein the static capacitor has a first capacitance value, the functional capacitor has a second capacitance value, and a ratio of the second capacitance value to the first capacitance value ranges from 0.1 to 1.0.

14. The acoustic-wave ladder filter according to claim 13 further comprising a piezoelectric substrate, wherein:

each of the first series resonator, the first shunt resonator, the grounding terminal and the functional capacitor is disposed on the piezoelectric substrate;

the functional capacitor is formed by one of a first capacitor structure and a second capacitor structure;

the first capacitor structure includes a first metal layer, a second metal layer being opposite to the first metal layer and a dielectric layer disposed between the first and the second metal layers;

the parallel circuit has a circuit terminal electrically coupled to the first port, wherein the first shunt resonator is electrically connected between the circuit terminal and the grounding terminal;

the first series resonator includes a first interdigital transducer having a first bus conductor and a first plurality of finger electrodes extending in a first specific direction from the first bus conductor;

the functional capacitor includes a second bus conductor extending from the first bus conductor, a second plurality of finger electrodes extending in a second specific direction from the second bus conductor, a third bus conductor being opposite to the second bus conductor and a third plurality of finger electrodes extending in a third specific direction being opposite to the second specific direction from the third bus conductor, wherein the second specific direction is substantially perpendicular to the first specific direction, and the second plurality of finger electrodes and the third plurality of finger electrodes constitute a fourth plurality of finger electrodes; and the acoustic-wave ladder filter is used for a diplexer.

15. The acoustic-wave ladder filter according to claim 14, wherein:

the first series resonator and the functional capacitor include the same material, and are formed simultaneously, wherein the second capacitor structure includes the fourth plurality of finger electrodes;

the first plurality of finger electrodes are disposed according to a first preset electrode pitch;

the fourth plurality of finger electrodes are disposed according to a second preset electrode pitch, wherein the second preset electrode pitch is less than the first preset electrode pitch; and the fourth plurality of finger electrodes are arranged to form an equal-distance electrode distribution, and includes a first finger electrode and a second finger electrode adjacent to the first finger electrode, wherein the first and the second finger electrodes have the same voltage polarity.

16. The acoustic-wave ladder filter according to claim 14, further comprising a second series resonator and a shunt circuit, wherein:

the second series resonator is coupled to and disposed between the first port and the circuit terminal in series, and has a first conductive terminal being opposite to the circuit terminal;

the shunt circuit is coupled to and disposed between the first conductive terminal and the grounding terminal, and includes a second shunt resonator and a functional circuit connected in series with the second shunt resonator, wherein the functional circuit includes a resistor having a resistance value ranging from 5 Ohms to 50 Ohms; and the second shunt resonator includes a second conductive terminal electrically connected to the first conductive terminal, a third conductive terminal being opposite to the second conductive terminal and a second interdigital transducer, wherein the functional circuit is electrically connected between the third conductive terminal and the grounding terminal.

17. The acoustic-wave ladder filter according to claim 16, wherein:

the functional circuit is formed by a conductive line structure, wherein the conductive line structure has a first physical structure physically forming the resistor, and is one selected from a group consisting of a bifilar coil, an incorporated meander coil and a strip line coil;

the conductive line structure includes a first turn-back conductive line and a second turn-back conductive line connected in series with the first turn-back conductive line, wherein the first turn-back conductive line is one of a first U-shaped conductive line and a first half-turn conductive line, and the second turn-back conductive line is one of a second U-shaped conductive line and a second half-turn conductive line; and the second shunt resonator, the grounding terminal and the functional circuit include the same material, and are formed simultaneously.

18. The acoustic-wave ladder filter according to claim 17, wherein:

the second interdigital transducer includes a bus bar, a plurality of metal electrodes extending in a first extension direction from the bus bar and the third conductive terminal directly electrically connected with the conductive line structure;

the conductive line structure includes a conductive line segment extending in a second extension direction from the third conductive terminal, wherein the second extension direction is substantially parallel with the first extension direction;

the functional circuit further includes an inductor connected in series with the resistor, wherein the inductor has an inductance value being less than 2 nano Henries (nH); and the conductive line structure further has a second physical structure physically forming the inductor, and includes a relatively narrow conductive line having a width ranging from 2 μm to 20 μm.

* * * * *